United States Patent
Kotani et al.

(10) Patent No.: US 7,489,206 B2
(45) Date of Patent: Feb. 10, 2009

(54) HIGH-FREQUENCY POWER DEVICE AND METHOD FOR CONTROLLING HIGH-FREQUENCY POWER

(75) Inventors: Hiroyuki Kotani, Osaka (JP); Hirotaka Takei, Osaka (JP); Ryohei Tanaka, Osaka (JP); Hiroshi Matoba, Osaka (JP)

(73) Assignee: Daihen Corporation, Osaka (JP)

( * ) Notice: Subject to any disclaimer, the term of this patent is extended or adjusted under 35 U.S.C. 154(b) by 528 days.

(21) Appl. No.: 11/360,491

(22) Filed: Feb. 24, 2006

(65) Prior Publication Data

US 2006/0220573 A1    Oct. 5, 2006

(30) Foreign Application Priority Data

| Feb. 25, 2005 | (JP) | P2005-052144 |
| Mar. 31, 2005 | (JP) | P2005-105429 |
| Mar. 31, 2005 | (JP) | P2005-105501 |
| Jul. 29, 2005 | (JP) | P2005-221788 |

(51) Int. Cl.
    *H03B 1/00* (2006.01)

(52) U.S. Cl. .................. 331/74; 331/16; 331/175; 315/224; 315/111.21

(58) Field of Classification Search .............. 331/74, 331/16, 175; 315/224, 111.21
See application file for complete search history.

(56) References Cited

U.S. PATENT DOCUMENTS 7,292,047 B2 * 11/2007 Tanaka et al. .............. 324/600
2007/0232249 A1 * 10/2007 Kwon et al. ............... 455/121

FOREIGN PATENT DOCUMENTS

JP          9-161994         6/1997

OTHER PUBLICATIONS

English language abstract of JP 9-161994.

* cited by examiner

*Primary Examiner*—Arnold Kinkead
(74) *Attorney, Agent, or Firm*—Greenblum & Bernstein, P.L.C.

(57) ABSTRACT

A high-frequency power device including: an oscillator; a high-frequency power supplier; a reflection coefficient calculator; a discharge signal output unit; and a frequency controller, wherein the frequency controller: instructs the oscillator to oscillate the oscillation signal at a first oscillation frequency for the period of time while a discharge signal is not in a state showing that the discharge has been commenced or in a state where the discharge is regarded as having been commenced; then instructs the oscillator to change the first oscillation frequency to a second oscillation frequency immediately after the discharge signal changes into the states; and then controls the oscillation frequency so that the absolute value is made small.

14 Claims, 18 Drawing Sheets

| Γ | 0.0 | 0.1 | 0.2 | 0.3 | 0.4 | 0.5 | 0.6 | 0.7 | 0.8 | 0.9 | 1.0 |
|---|---|---|---|---|---|---|---|---|---|---|---|
| Γup | 0.10 | 0.15 | 0.2 | 0.2 | 0.2 | 0.2 | 0.2 | 0.2 | 0.2 | 0.2 | 0.2 |

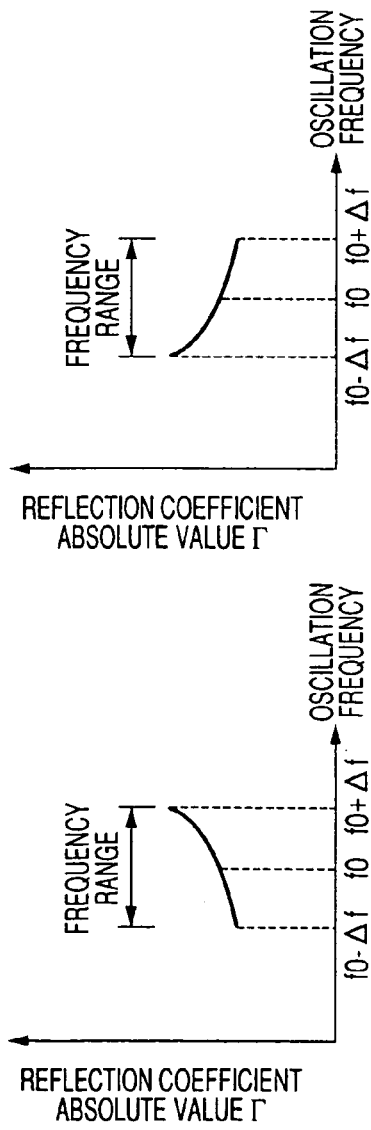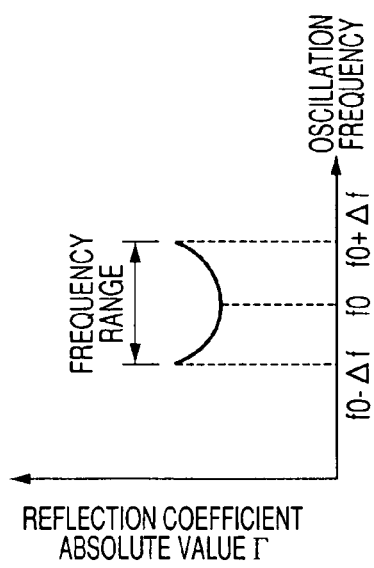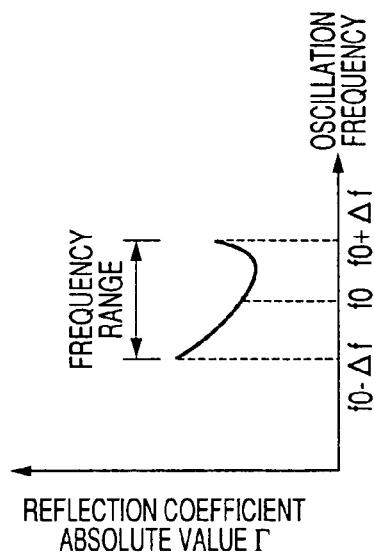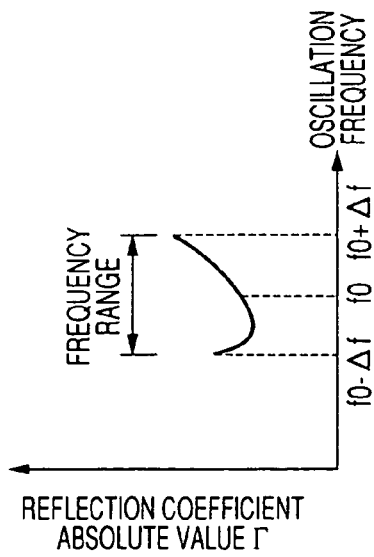

HIGH-FREQUENCY POWER DEVICE AND METHOD FOR CONTROLLING HIGH-FREQUENCY POWER

BACKGROUND OF THE INVENTION

1. Technical Field of the Invention

The present invention relates to a high-frequency power device for supplying power to a load such as a plasma processing unit, etc., which is employed for applications accompanying discharge such as, for example, plasma etching, plasma CVD, etc.

2. Description of the Related Art

As a high-frequency power device for supplying power to a load accompanying discharge, a high-frequency power device is available, which varies the oscillation frequency of an internal oscillation circuit 52 before and after commencement of discharge in a load.

FIG. 19 is a view depicting a configuration of a conventional high-frequency power device 50 and a connection between a high-frequency power device 50, an automatic matching unit 6, and a load 5. (see, for example, Japanese Published Unexamined Patent Application No. Hei-9-161994)

The high-frequency power device 50 outputs high-frequency power using a power amplifier 53, and the output value of high-frequency power detected by a power measuring unit 54 is controlled so that the output value becomes a target value established by a power setting unit 56. Also, the output frequency of the high-frequency power device is determined by the oscillation frequency of the oscillation circuit 52 whose oscillation frequency is controlled by a frequency controlling circuit 51. The high-frequency power output from the high-frequency power device 50 is supplied to the load 5 via a transmission line 2 composed of a coaxial cable, an automatic matching unit 6 and a load connection portion composed of a shielded copper plate. In addition, an ON/OFF controlling circuit 58 controls to turn on and off the output of the oscillation circuit 52. The oscillation circuit 52 outputs a high-frequency signal when an ON signal is output from the ON/OFF controlling circuit 58. The ON/OFF controlling circuit 58 is controlled by operating a power output switch (not illustrated) provided in the high-frequency power device 50 or is controlled by a control signal from an external device.

The automatic matching unit 6 is employed for the purpose of efficiently supplying high-frequency power to a load by matching both of impedance, which are the power side impedance Zo (usually 50Ω) which is observed from the input terminal of the automatic matching unit 6 to the high-frequency power device 50 side via the transmission line 2, and the load side impedance ZL (impedance of the automatic matching unit 6, the load connection portion 4 and the load 5) which is observed from the input terminal of the automatic matching unit 6 to the load side. The automatic matching unit 6 is internally provided with a variable impedance element (for example, a variable capacitor, variable inductor, etc.,) (not illustrated), wherein the automatic matching unit 6 has a feature of varying impedance of the variable impedance element so that the power device side impedance Zo and the load side impedance ZL are impedance-matched to each other.

The load 5 is an apparatus that is provided with a processing section and processes (etches, CVD-deposits, etc.) a workpiece such as a wafer, liquid crystal substrate, etc., brought into the interior of the processing section. In order to process the workpieces, a plasma discharge gas is introduced into the processing section, and high-frequency power (voltage) supplied from the high-frequency power device 50 is applied to the plasma discharge gas, the load 5 discharges the plasma discharge gas to bring a non-plasma state into a plasma state. And, the workpieces are processed by utilizing the plasma. Further, a load accompanying such a discharge is called a "discharge load."

The discharge detecting unit 57 detects existence of discharge in a load and outputs a detection signal to the frequency controlling circuit 51 and the automatic matching unit 6. Since the frequency controlling circuit 51 and the automatic matching unit 6 are able to judge, based on the detection signal, whether or not discharge occurs in the load, it is possible to vary the control, depending on the state of discharge. Next, a description is given of the control.

In the discharge load described above, it has been known that the load side impedance ZL which is observed from the high-frequency power device 50 to the load side radically changes before and after commencement of discharge in the load. However, the variable impedance element of the automatic matching unit 6 described above cannot significantly vary the impedance instantaneously in view of its structure. In order to significantly vary the impedance by using the variable impedance element of the automatic matching unit 6, time of one second through several seconds is required in some cases.

Therefore, since the automatic matching unit 6 cannot follow a radical change in impedance if the impedance is matched by the automatic matching unit 6 during the time, there may be cases where no matched state is brought about immediately after commencement of discharge. As a result, the reflection is increased, power necessary to maintain discharge cannot be supplied to the load, wherein there may be a problem that plasma generated by discharge, etc., disappears.

To the contrary, since the output frequency of the high-frequency power device 50 can be instantaneously varied, it is possible to instantaneously match the impedance by varying the load side impedance ZL by changing the output frequency. Therefore, in the conventional high-frequency power device 50, such a control has been employed, which varies the load side impedance ZL by varying the output frequency of the high-frequency power device 6 without using the automatic matching unit 50 when the impedance radically changes before and after commencement of discharge. That is, such a control as shown in Steps 1 through Step 3 below is carried out. Also, it is sufficient to vary the oscillation frequency of the oscillation circuit 52 in order to vary the output frequency of the high-frequency power device 50. In the description of the following Step 1 through Step 3, the oscillation frequency of the oscillation circuit 52 is used for description regarding a change in the output frequency of the high-frequency power device, in order to describe a detailed control method.

Step 1: Until commencement of discharge, the oscillation frequency of the oscillation circuit 52 is varied so as to be impedance-matched to the resonance frequency of the load side impedance ZL before commencement of discharge. That is, discharge is commenced with the load side impedance ZL which is easy to commence the discharge. Also, at this time, the variable impedance element of the automatic matching unit 6 does not operate.

Step 2: After commencement of the discharge, the oscillation frequency of the oscillation circuit 52 is set to a predetermined fixed frequency suitable for discharge. The oscillation frequency is obtained by simulations and experiments, etc.

Step 3: High frequency is output at the oscillation frequency established in Step 2, and the impedance is matched by using the automatic matching unit 6.

In the above-described high-frequency power device 50 capable of varying the output frequency, it is possible to cope with a radical change in the load side impedance ZL by varying the output frequency even before and after commencement of discharge. However, since respective components such as a variable impedance element in the load and automatic matching unit have different characteristics in connection with the frequency, the load side impedance differs, depending on the states of the respective components at that time, even with the same change in the output frequency. For example, where the high-frequency power device 50 in which the variable range of the output frequency is 13.56±0.5 MHz is used, and the load side impedance ZL is 30+j30Ω, when the output frequency is increased by 0.04 MHz from 13.56 MHz to 13.60 MHz, the load side impedance ZL becomes 50+j0Ω in the state A, but it becomes 20+j20Ω in the state B.

That is, since there is no relationship between the output frequency of the high-frequency power device 50 and the load side impedance ZL, it is not possible that the load side impedance ZL is measured, and the output frequency of the high-frequency power device 50 is varied in association with the measured value. For example, when the load side impedance ZL becomes 30+j30Ω, it is not always possible to match the impedance by setting the frequency to 13.60 MHz, wherein no association can be established. Accordingly, in order to match the impedance by varying the output frequency, it is necessary to vary the output frequency at random.

In the conventional high-frequency power device 50, due to the above-described situations in terms of control, it is considered that such controls as described in Steps 1 through 3 are carried out. That is, in Step 1, since the discharge is before commencement, almost the entire reflection state is brought about. Therefore, even if the output frequency is varied at random, no adverse influence is brought about until the discharge is commenced with the impedance matched. Rather, since the output frequency can be instantaneously varied, it is possible to match the impedance in a shorter time than matching the impedance by the automatic matching unit employing a variable impedance element. In step 2, since the load side impedance ZL radically changes immediately after the discharge is commenced, it is further preferable to match the impedance by frequency conversion because the impedance can be instantaneously matched. In Step 3, since the impedance is matched after the discharge is commenced, it is difficult to match the impedance by changing the output frequency due to the above-described situations. Therefore, the impedance is matched by using the automatic matching unit 6.

Thus, in regard to a problem that the impedance radically changes before and after commencement of discharge in the conventional high-frequency power device 50, the problem can be solved by varying the output frequency of the high-frequency power device. However, in connection to matching of the impedance after commencement of discharge, the automatic matching unit 6 is still used, wherein there are the following problems.

(1) Since the variable impedance element used in the automatic matching unit 6 is provided with a movable portion, the movable portion is subjected to wearing, wherein mechanical longevity is reached. For example, where a variable capacitor is used as the variable impedance element, since the axis of the variable capacitor connected to a motor rotates, the sliding portion between the axis of the variable capacity and a bearing is subjected to wearing, and the wearing reaches mechanical longevity. In particular, since, in the discharge load, the impedance of the load always fluctuates, the variable impedance element also always moves. Accordingly, the wearing degree is made large. Also, since the movement of the variable impedance element differs under the conditions of the load, etc., the period of time to mechanical longevity differs in the respective variable impedance elements. In this connection, as the variable impedance element reaches mechanical longevity, it is necessary that the variable impedance element is replaced or the automatic matching unit 6 is replaced. In this case, it is necessary to carry out replacement work once the production line is stopped. Based on such reasons, it is desired that replacement of the variable impedance element and the automatic matching unit 6 is eliminated. However, in the automatic matching unit 6, since the variable impedance element is employed, there may be cases where the replacement is unavoidable when the components thereof reach mechanical longevity.

(2) In recent years, a demand for lower production costs in the entire apparatus including the high-frequency power device 50 and a demand for downsizing thereof have increased. Since, in the automatic matching unit 6, the variable impedance element is expensive and a motor is required to drive the variable impedance element, the automatic matching unit 6 becomes remarkably expensive, resulting in an increase in the production costs of the entire apparatus including the high-frequency power device 50. In addition, since the structure of the automatic matching unit 6 is complicated and the variable impedance element which is a major part thereof is large-sized, it is difficult to downsize the apparatus.

(3) A demand for further higher speed has been brought about in impedance matching during discharge after the discharge is commenced. However, since the automatic matching unit 6 is conventionally used, the internal variable impedance element cannot instantaneously operate, wherein there may be cases where time of one second through several seconds is required until the impedance is matched.

(4) Further, in the conventional high-frequency power device 50, discharge in the load 5 is detected by using the discharge detecting unit 57. There are various systems of the discharge detecting unit 57, for example, a system for detecting light emission when discharge occurs, a system for detecting a direct current voltage generated in load, etc., are available. However, if the discharge detecting unit 57 is used, there is a problem that the configuration of the high-frequency power device 50 is made complicated. For example, in the system for detecting light emission when discharge occurs, since it is necessary to attach the discharge detecting unit 57 in the vicinity of the load 5, and it is necessary to provide a signal line between the discharge detecting unit 57 and the main body of the high-frequency power device 50, the configuration becomes complicated. In addition, the discharge detecting unit 57 is not inexpensive.

SUMMARY OF THE INVENTION

The present invention was developed in view of the above-described situations. It is an object of an embodiment of the invention to provide a high-frequency power device which does not require any automatic matching unit, and is capable of matching impedance during discharge, achieving a longer service life of the matching unit, decreasing the production costs thereof, and downsizing the unit, and finally is capable of achieving a longer service life of the entire apparatus including the high-frequency power device, decreasing the production costs thereof, and downsizing the entire apparatus, and capable of shortening the matching time (time required to match the impedance) during discharge. Further, it is another object of the embodiment of the invention to provide a high-frequency power device not requiring the discharge detecting unit 57.

A high-frequency power device provided by the first aspect of the invention is a high-frequency power device for supplying high-frequency power to a load accompanying electric discharge and varying an oscillation frequency of an internal oscillator before and after commencement of discharge in the load, the same high-frequency power device including: oscillator capable of varying an oscillation frequency in compliance with an instruction; means, in which oscillation signals output from the oscillator are amplified and are made into a power generation source, for supplying high-frequency power to the load; means for calculating the absolute value of a reflection coefficient based on information of high-frequency oriented from the high-frequency power supplier toward the load side and of high-frequency oriented from the load side toward the high-frequency power supplier and outputting the calculated absolute value of the reflection coefficient; discharge signal output unit for outputting a signal to change the oscillation frequency of the oscillator before and after commencement of discharge in a load; and frequency controller for instructing an oscillation frequency to the oscillator; wherein the frequency controller instructs the oscillator to oscillate at a first predetermined oscillation frequency for the period of time while the output signal of the discharge signal output unit is not in a state showing that the discharge has been commenced or in a state where the discharge is regarded as having been commenced, next changes the instruction so as to cause the oscillator to oscillate at a second predetermined oscillation frequency immediately after the output signal of the discharge signal output unit is in a state showing that the discharge has been commenced or in a state where the discharge is regarded as having been commenced, and next controls the oscillation frequency of the oscillator so that the absolute value of the reflection coefficient is made small.

A high-frequency power device provided by the second aspect of the invention is featured in that the frequency controller specifies the oscillation frequency at which the absolute value of the reflection coefficient is minimized when the second predetermined oscillation frequency is made into a reference frequency and the oscillation frequency of the oscillator is varied within the range of predetermined frequencies including the reference frequency; stops a change of the oscillation frequency; determines the upper limit value of the reflection coefficient corresponding to the absolute value of the reflection coefficient at that time; next, instructs the oscillator to oscillate at the reference frequency where the absolute value of the reflection coefficient is the upper limit value of the reflection coefficient or less; where the absolute value of the reflection coefficient exceeds the upper limit value of the reflection coefficient, specifies an oscillation frequency at which the absolute value of the reflection coefficient is minimized when the oscillation frequency of the oscillator is varied in the range of predetermined frequencies including the reference frequency; stops a change in the oscillation frequency; determines the upper limit value of the reflection coefficient corresponding to the absolute value of the reflection coefficient at that time; and controls the oscillation frequency of the oscillator so that the absolute value of the reflection coefficient is made small, by making the specified oscillation frequency into a new reference frequency.

A high-frequency power device provided by the third aspect of the invention is featured in further comprising: memory for storing the relationship between the absolute value of the reflection coefficient and the upper limit value of the reflection coefficient in the case of the specified oscillation frequency, wherein the frequency controller determines the upper limit value of the reflection coefficient corresponding to the absolute value of the reflection coefficient based on the relationship stored in the memory.

A high-frequency power device provided by the fourth aspect of the invention is featured in that the frequency controller determines the upper limit value of the reflection coefficient corresponding to the absolute value of the reflection coefficient based on a function by which the relationship between the absolute value of the reflection coefficient and the upper limit value of the reflection coefficient in the case of the specified oscillation frequency is determined.

A high-frequency power device provided by the fifth aspect of the invention is featured in further including frequency abnormality judging unit, into which the second predetermined oscillation frequency and the specified oscillation frequency are input, for calculating a deviation between the second predetermined oscillation frequency and the specified oscillation frequency, and for judging an abnormality when the deviation exceeds a predetermined permissible frequency.

A high-frequency power device provided by the sixth aspect of the invention is featured in further including: means for measuring the time elapsed after the oscillator is instructed so as to oscillate at the first predetermined frequency or the time elapsed after the instruction is changed to cause the oscillator to oscillate from the first predetermined frequency to the second predetermined oscillation frequency; and initial abnormality judging unit for judging an abnormality where the absolute value of the reflection coefficient does not become the predetermined value of the reflection coefficient or less until the time measured by the after-frequency-instruction time measuring means reaches a predetermined time.

A high-frequency power device provided by the seventh aspect of the invention is featured in that the discharge signal output unit is discharge detecting unit for detecting existence of discharge in the load, and the frequency controller inputs a detection signal for showing existence of discharge in a load, which is output from the discharge detecting unit, and the absolute value of a reflection coefficient output from the reflection coefficient calculator when high-frequency power is supplied from the high-frequency power supplier to a load; judges by means of an output signal of the discharge detecting unit whether or not discharge is commenced; instructs the oscillator to oscillate at the first predetermined oscillation frequency when it is not judged that discharge has been commenced in the load; next, changes the instruction, so that the oscillator is caused to oscillate at the second predetermined oscillation frequency, immediately after it is judged that discharge has been commenced in the load; and next controls the oscillation frequency of the oscillator so that the absolute value of the reflection coefficient is made small.

A high-frequency power device provided by the eighth aspect of the invention is featured in that the discharge signal output unit is means for measuring the time elapsed from commencement of supply of high-frequency power from the high-frequency power supplier to a load; and the frequency controller inputs the time of measurement output from the means for measuring the time after commencement of supply and the absolute value of the reflection coefficient, which is output from the reflection coefficient calculator; instructs the oscillator to oscillate at the first predetermined frequency when the time measured by the means for measuring the time after commencement of supply does not reach the predetermined discharge estimation time in a state where high-frequency power is supplied from the high-frequency power supplier to a load; next changes the instruction, so that the oscillator is caused to oscillate at the second predetermined oscillation frequency, immediately after the time measured by the means for measuring the time after commencement of supply reaches the predetermined discharge estimation time, and next controls the oscillation frequency of the oscillator so that the absolute value of the reflection coefficient is made small.

A method for controlling high-frequency power, which is provided by the ninth aspect of the invention is a method for controlling high-frequency power, which supplies high-frequency power to a load accompanying discharge and varies the oscillation frequency to determine the frequency of high-frequency power before and after commencement of discharge in a load, and the same method including the steps of: outputting high-frequency power with the oscillation frequency made into a first predetermined oscillation frequency until discharge is commenced in a load or until the time at which the time of commencing discharge high-frequency power from the high-frequency power device to a load is made into a reference reaches a predetermined discharge estimation time, in a state where high-frequency power is supplied from the high-frequency power device to the load; next changing the oscillation frequency to a second predetermined oscillation frequency immediately after discharge is commenced in a load or immediately after the time at which the time of commencing discharge high-frequency power from the high-frequency power device to a load is made into a reference reaches a predetermined discharge estimation time, and outputting the high-frequency power; and next controlling the oscillation frequency so that the absolute value of the reflection coefficient is made small.

A method for controlling high-frequency power, which is provided by the tenth aspect of the invention is featured in including the steps of: when controlling the oscillation frequency so that the absolute value of the reflection coefficient is made small, specifying the oscillation frequency at which the absolute value of the reflection coefficient is minimized when outputting high-frequency power while varying the oscillation frequency in a range of predetermined frequency including the reference frequency with the second predetermined oscillation frequency made into the reference frequency; stopping a change in the oscillation frequency, and determining the upper limit value of the reflection coefficient corresponding to the absolute value of the reflection coefficient at that time; and next outputting high-frequency power in a state of the reference frequency where the absolute value of the reflection coefficient is the upper limit value or less; specifying the oscillation frequency at which the absolute value of the reflection coefficient is minimized when outputting high-frequency power while varying the oscillation frequency in a range of predetermined frequency including the reference frequency where the absolute value of the reflection coefficient exceeds the upper limit value; stopping a change in the oscillation frequency; determining the upper limit value of the reflection coefficient corresponding to the absolute value of the reflection coefficient at that time; and simultaneously making the specified oscillation frequency into a new reference frequency.

A method for controlling high-frequency power, which is provided by the eleventh aspect of the invention is featured in that the relationship between the absolute value of the reflection coefficient and the upper limit value of the reflection coefficient at the specified oscillation frequency is stored in advance, and the upper limit value of the reflection coefficient corresponding to the absolute value of the reflection coefficient is determined on the basis of the stored relationship.

A method for controlling high-frequency power, which is provided by the twelfth aspect of the invention is featured in that the relationship between the absolute value of the reflection coefficient and the upper limit value of the reflection coefficient in the specified oscillation frequency is determined in advance by a function, and the upper limit value of the reflection coefficient corresponding to the absolute value of the reflection coefficient is determined on the basis of the function.

A method for controlling high-frequency power, which is provided by the thirteenth aspect of the invention is featured in that a deviation between the second predetermined oscillation frequency and the specified oscillation frequency is calculated by inputting the second predetermined oscillation frequency and the specified oscillation frequency, and where the deviation exceeds a predetermined permissible frequency, it is judged to be abnormal.

A method for controlling high-frequency power, which is provided by the fourteenth aspect of the invention is featured in that, where the absolute value of the reflection coefficient does not become the predetermined value of the reflection coefficient or less until the time elapsed after an instruction of oscillating at the first predetermined frequency is issued or the time elapsed after an instruction of varying the oscillation frequency from the first predetermined frequency to the second predetermined oscillation frequency is issued reaches a predetermined period of time, it is judged to be abnormal.

According to the first aspect of the invention, an instruction is changed so that, immediately after discharge is commenced in a load or immediately after discharge is regarded as having been commenced, the oscillator oscillates at the second predetermined oscillation frequency determined in advance, and next, the oscillation frequency of the oscillator is controlled so that the absolute value of the reflection coefficient is made small. Thereby, even if a fixed matching unit is used, it is possible to match the impedance during discharge after the discharge is commenced. In addition, since the fixed matching unit is not provided with a variable impedance element in which a movable portion is provided, a longer service life can be secured than that of the automatic matching unit. Also, where the fixed matching unit is used, it is not necessary to stop the production line to replace a variable impedance element or to replace the automatic matching unit as in the case of using the automatic matching unit. Further, since the production cost of the fixed matching unit is markedly more inexpensive in comparison with the automatic matching unit, it is possible to lower the costs of the entire apparatus including the high-frequency power device. In addition, since the structure of the fixed matching unit is simple, further downsizing can be achieved in comparison with the automatic matching unit. Finally, it is possible to achieve downsizing of the entire apparatus including the high-frequency power device. Herein, the effect of the ninth aspect of the invention is similar to that of the first aspect of the invention. Also, since the seventh aspect and the eighth aspect of the invention are concretely detailed from the first aspect of the invention, the effect of the seventh aspect and the eighth aspect of the invention is similar to the effect of the first aspect of the invention.

Also, the predetermined discharge estimation time of the eighth aspect of the invention is presumed from the data in which the time from commencement of supply of high-frequency power from high-frequency power supplier to a load to the commencement of discharge is obtained by experiments, etc. Usually, since the time from commencement of supply of high-frequency power to a load to commencement of discharge is substantially constant under the same conditions, by checking whether or not the discharge estimation time has been reached, it can be presumed whether or not discharge is commenced. Accordingly, without using a conventional discharge detecting unit in the eighth aspect of the invention, the time elapsed commencement of supply of high-frequency power from the high-frequency power supplier to a load is measured by using the after-supply-commencement time measuring means, and it is possible to change the oscillation frequency of the oscillator from the first predetermined frequency to the second predetermined oscillation frequency at a timing when the time measured by the after-supply-commencement time measuring means reaches to the predetermined discharge estimation time. Since the after-supply-commencement time measuring means may be composed of an inexpensive timer, the cost of a high-frequency power device can be further lowered in comparison with the high-frequency power device employing a conventional discharge detecting unit. In addition, since the composition of the timer is simple, it is possible to simplify the configuration of the high-frequency power device in comparison with the prior arts. As a matter of course, the first aspect and the ninth aspect of the invention can bring about an effect similar to the eighth aspect of the invention where the conventional discharge detecting unit is not employed.

According to the second aspect of the invention, with respect to control for matching of impedance, the impedance is matched while specifying the oscillation frequency so that the absolute value of the reflection coefficient is minimized when the oscillation frequency of the oscillator is varied in the predetermined frequency range including the reference frequency. Therefore, it is possible to limit the oscillation frequency width which can be varied at one time. At this time, by narrowing the variation width of the oscillation frequency as much as possible, a fluctuation in the impedance of a load accompanying a change in the oscillation frequency can be reduced. That is, since, where the absolute value of the reflection coefficient is increased in the impedance matching process, the increment is slight, and control is carried out so that the absolute value of the reflection coefficient is made small immediately thereafter, a load and a workpiece in the load are not adversely influenced. Therefore, it is possible to match the impedance by a system of varying the oscillation frequency of the oscillator even during discharge after commencement of discharge. Furthermore, since the oscillation frequency can be instantaneously changed, impedance matching can be carried out at higher speed than in the conventional automatic matching unit employing a variable impedance element in which there is a limit in the actuation speed even if the fluctuation width of the oscillation frequency, which can be changed at one time, is narrow.

Further, since, in the second aspect of the invention, the oscillation frequency at which the absolute value of the reflection coefficient is minimized is specified, a change in the oscillation frequency is stopped, the upper limit value of the reflection coefficient corresponding to the absolute value of the reflection coefficient at that time is determined, and processing is carried out in compliance with the relationship between the absolute value of the reflection coefficient and the upper limit value of the reflection coefficient at that time, control by which the absolute value of the reflection coefficient can be immediately reduced can be carried out in a case where the absolute value of the reflection coefficient is comparatively large, and at the same time, in a case where the absolute value of the reflection coefficient is comparatively small, such a control by which the absolute value of the reflection coefficient does not become excessively large can be carried out while avoiding that the discharge becomes unstable. Also, the effect of the tenth aspect of the invention is similar to the effect of the second aspect of the invention.

According to the third aspect or the fourth aspect of the invention, since the relationship between the absolute value of the reflection coefficient and the upper limit value thereof when the specified oscillation frequency is taken is stored in the memory, or a function to determine the relationship between the absolute value of the reflection coefficient and the upper limit value thereof when a specified oscillation is taken is established, it is possible to easily vary the relationship between the absolute value of the reflection coefficient and the upper limit value thereof. In addition, the effect of the eleventh aspect of the invention is similar to that of the third aspect thereof, and the effect of the twelfth aspect of the invention is similar to that of the fourth aspect thereof.

According to the fifth aspect of the invention, since, where the deviation between the second predetermined oscillation frequency and the reference frequency as a specified oscillation frequency is calculated, and the deviation exceeds a predetermined permissible frequency, it is judged to be abnormal, it becomes possible to detect an abnormality by monitoring a fluctuation in the frequency. As described above, where the deviation in the frequencies exceeds a predetermined permissible frequency, there is a high possibility that an abnormality occurs. For example, there is a possibility that the state of plasma changes due to contamination in a plasma processing apparatus, which becomes a load, in comparison with a state immediately after the plasma processing apparatus is cleaned up, and that the state of plasma also changes since the gas flow amount is reduced below a predetermined value due to a failure in the apparatus. Where an abnormality like the above occurs, it is preferable that a countermeasure corresponding to the situation, such as stopping of supply of high-frequency power from a high-frequency power device to a load, etc., is carried out. Accordingly, it is advantageous to detect an abnormality as described above. Also, the effect of the thirteenth aspect of the invention is similar to that of the fifth aspect of the invention.

According to the sixth aspect of the invention, at the beginning of a process from the time when an instruction is changed so as to oscillate from the first predetermined frequency to the second predetermined oscillation frequency to the time of reaching a predetermined set time, it is possible to detect an abnormality if an abnormality occurs, as in the fifth aspect of the invention. In addition, the effect of the fourteenth aspect of the invention is similar to that of the sixth aspect thereof.

BRIEF DESCRIPTION OF THE DRAWINGS

FIG. 5 is a view depicting the relationship between the oscillation frequency and the reflection coefficient absolute value Γ where, as the frequency range including the reference frequency f0, the minimum oscillation frequency is set to f0−Δf and the maximum oscillation frequency is set to f0+Δf;

DETAILED DESCRIPTION OF THE INVENTION

Hereinafter, a detailed description is given of the invention with reference to the accompanying drawings.

Embodiment 1

Figure 1:
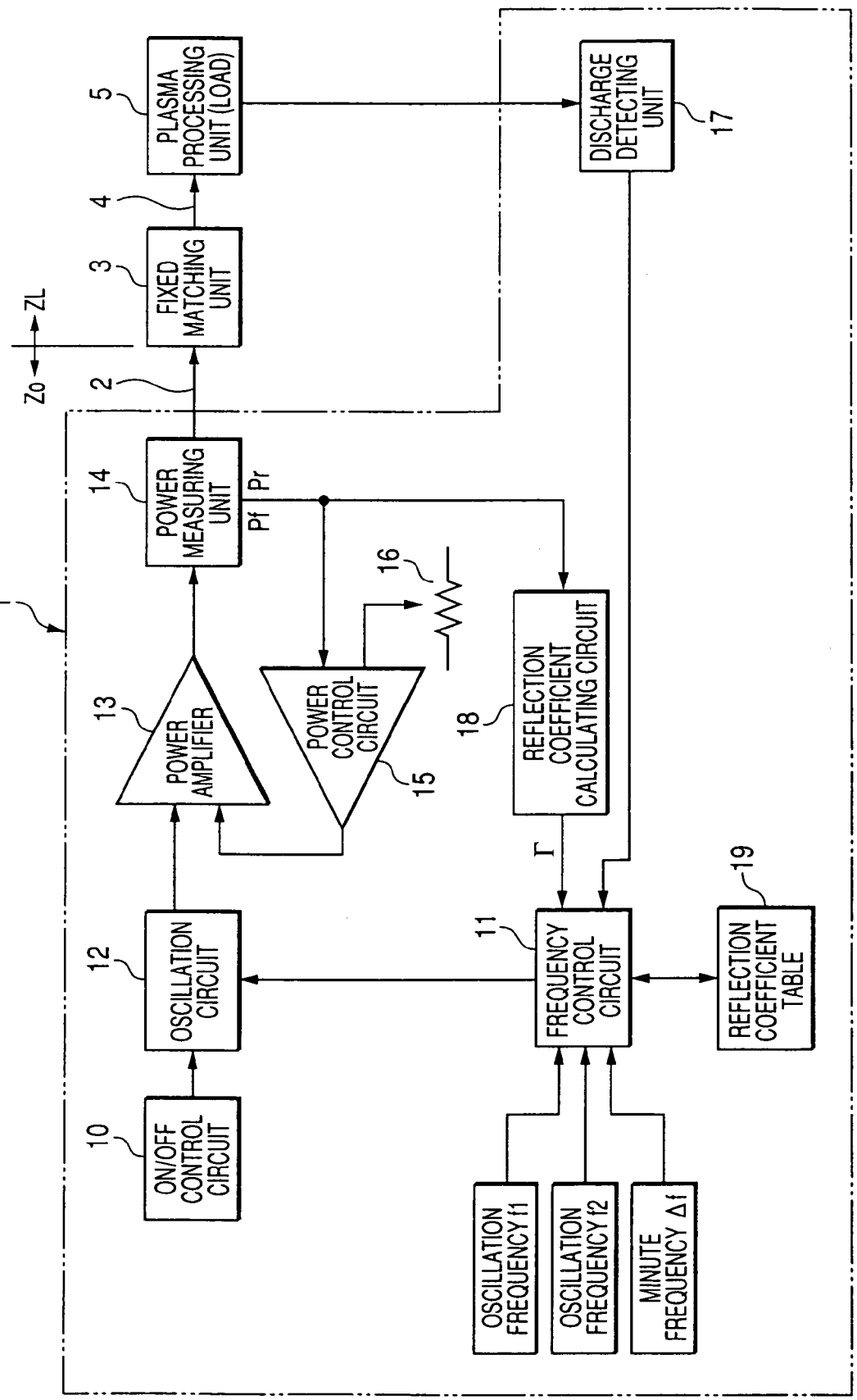
FIG. 1 is a view depicting a configuration of a high-frequency power device 1 according to Embodiment 1 of the invention and a connection between the high-frequency power device 1, the fixed matching unit 3 and the load 5.

FIG. 1 is a view showing a configuration of a high-frequency power device 1 according to Embodiment 1 of the invention and a connection between the high-frequency power device 1, a fixed matching unit 3 and a load 5.

The high-frequency power device 1 amplifies high-frequency signals output from an oscillation circuit 12 by using a power amplifier 13, and supplies generated high-frequency power to a load 5. Also, since the high-frequency power device 1 is a source of generation of high-frequency power to be supplied to a load, it may be merely called a "high-frequency source." High-frequency power output from the high-frequency power device 1 is supplied to the load 5 via a transmission line 2 composed of a coaxial cable, a fixed matching unit 3, and a load connection portion 4 composed of a shielded copper plate. In addition, generally, this type of high-frequency power device 1 outputs high-frequency power of several hundreds of kHz or more. Also, the power amplifier 13 functions as high-frequency power supplier pertaining to the invention.

In addition, an ON/OFF control circuit 10 controls ON and OFF of output of the oscillation circuit 12. The oscillation circuit 12 outputs high-frequency power signals when the ON/OFF control circuit 10 outputs an ON signal. The ON/OFF control circuit 10 is controlled by operating a power output switch (not illustrated) provided in the high-frequency power device 1 or is controlled by a control signal from an external device. In addition, the oscillation circuit 12 functions as oscillator of the invention.

Since power of the high-frequency power device 1 is controlled in such a manner that high-frequency output from the power amplifier 13 is converted to a power value and is measured by a power measuring unit 14 provided at the rear stage of the power amplifier 13, and output is controlled so that the measured power value becomes equivalent to the power target value established by a power setting unit 16, the power measurement value and the power target value are input into the power control circuit 15, and a control signal is output to the power amplifier 13 so that the deviation of the power measurement value to the power target value is eliminated.

In addition, the power measuring unit 14 has a function of not only outputting a high frequency output from the power amplifier 13, that is, a power measurement value of a forward wave obtained by converting the forward wave to a power value and measuring the same, but also outputting a power measurement value of a reflected wave obtained by converting a reflected wave reflected and oriented from a load side to the power amplifier 13 to a power value and measuring the same. The power measuring unit 14 may be composed of a directional coupler (not illustrated) and a conversion circuit for converting an output of the directional coupler to a power value.

Further, in FIG. 1, a target to be controlled by the power control circuit 15 may be a power measurement value of the forward wave, or may be a power measurement value at the load side, which is obtained by subtracting the power measurement value of the reflected wave from the power measurement value of the forward wave. In FIG. 1, even where the power measurement value at the load side is made into a control target, the connection line from the power measuring unit 14 to the power control circuit 15 is depicted only with a single line in order to simplify the illustration. Additionally, although the power measurement value of the forward wave and the power measurement value of the reflected wave, which are output from the power measuring unit 14, are input into the reflection coefficient calculating circuit 18 described later, the connection line from the power measuring unit 14 to the reflection coefficient calculating circuit 18 is depicted only with a single line.

Also, the output frequency of the high-frequency power device 1 is determined by an oscillation frequency of the oscillating circuit 12. Further, the oscillation frequency of the oscillating circuit 12 is controlled by the frequency control circuit 11. The frequency control circuit 11 determines an oscillation frequency by using an output of the reflection coefficient calculating circuit 18 described later and the reflection coefficient table 19, and carries out control of the oscillation frequency by outputting an instruction to determine the oscillation frequency of the oscillating circuit 12. The details thereof are described later. In addition, the frequency controlling circuit 11 and the frequency control circuits 11a through 11e described later function as the frequency controller of the invention.

The reflection coefficient calculating circuit 18 calculates the absolute value of the reflection coefficient (hereinafter called the reflection coefficient absolute value) based on the power measurement value of forward wave output from the power measuring unit 14 and the power measurement value of the reflected wave and outputs the calculated reflection coefficient absolute value $\Gamma$. Where the power measurement value of the forward wave is expressed as Pf and the power measurement value of reflected wave is expressed as Pr, the reflection coefficient absolute value $\Gamma$ is expressed by the following equation (1). Also, the reflection coefficient calculating circuit 18 functions as the reflection coefficient calculator of the invention.

$$\text{Reflection coefficient absolute value } \Gamma = \sqrt{Pr}\sqrt{Pf} \quad (1)$$

The discharge detecting unit 17 detects existence of discharge in the load 5, and outputs a detection signal to the frequency control circuit 11. Since, with the frequency controlling circuit 11, it is possible by the detection signal to detect whether or not discharge occurs in the load, it is possible to change control depending on the state of discharge. In addition, the discharge detecting unit 17 functions as discharge signal output unit and discharge detecting unit of the invention.

A reflection coefficient table 19 stores the relationship between the reflection coefficient absolute value $\Gamma$ and the reflection coefficient upper limit value $\Gamma$up, wherein since the frequency control circuit 11 refers to the data stored in the reflection coefficient table 19, it is possible to obtain the reflection coefficient upper limit value $\Gamma$up corresponding to the reflection coefficient absolute value $\Gamma$. For example, a recording medium such as a ROM (Read-Only-Memory), a hard disk, a flash memory, etc., may be used for the reflection coefficient table 19. A detailed example of the reflection coefficient table 19 will be described later. Further, the reflection coefficient table 19 functions as the memory of the invention.

The fixed matching unit 3 is a device used for efficiently supplying high-frequency power to a load by matching the power source side impedance Zo (usually, 50$\Omega$) when observed from the input terminal of the fixed matching unit 3 to the high-frequency power device I side via the transmission line 2 and the load side impedance ZL (impedance of the fixed matching unit 3, the load connection portion 4 and the load 5) when observed from the input terminal of the fixed matching unit 3 to the load side. The fixed matching unit 3 is internally provided with a fixed impedance element (not illustrated) (for example, a fixed capacitor, a fixed inductor, etc.). The constant is obtained through simulations and experiments so that the power source side impedance Zo and the load side impedance ZL are matched to each other. Therefore, although the impedance matching is possible only for a specified load impedance, the structure thereof is further simplified and downsized in comparison with the automatic matching unit 6, and the cost thereof is lower still. In addition, since the fixed matching unit 3 is not provided with a variable impedance element in which a movable portion is provided, a further longer service life can be secured. Finally, a longer service life of the entire apparatus including the high-frequency power device 1 can be achieved.

Next, a description is given of actions in the case where high-frequency power is supplied to the load 5, using the above-described high-frequency power device 1.

(1) Until Discharge Begins:

Discharge is commenced as high-frequency power is supplied from the high-frequency power device 1 to the load 5 and voltage exceeding a discharge commencement voltage is applied to gas in a plasma processing apparatus which becomes the load 5. Although the discharge commencement voltage differs, depending on the gas pressure and types of gas, a comparatively high voltage is required.

Figure 2:
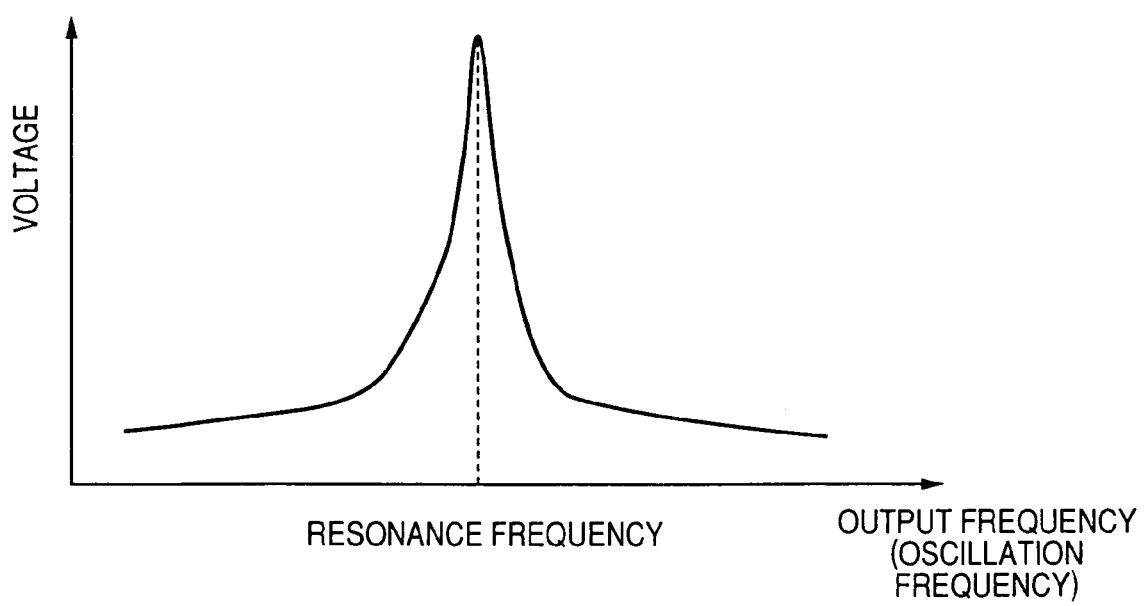
FIG. 2 is a frequency characteristic view depicting one example of he relationship between the output frequency of the high-frequency power device 1 and voltage applied to a plasma processing apparatus which becomes the load 5.

FIG. 2 is a frequency characteristics view depicting one example of the relationship between an output frequency of the high-frequency power device 1 and a voltage applied to the plasma processing apparatus which becomes a load 5, and the drawing depicts the result of a simulation where it is assumed that power is supplied to the load 5 with the output power of the high-frequency power device 1 fixed at 3 kW. Also, herein, the load conditions used for the simulation and constant of a fixed impedance element of the fixed matching unit 3 are omitted for simplification of description.

As is made clear in FIG. 2, even if the same power is supplied to a load, the voltage values applied to the load 5 differ from each other, depending on the output frequencies of the high-frequency power device 1, and is maximized at the resonance frequency. Further, the voltage value applied to the load 5 is lowered, while deviating from the resonance frequency. For this reason, the voltage can be further efficiently applied at a frequency nearer to the resonance frequency, and the efficiency is further worsened in line with deviating from the resonance frequency. Therefore, to exceed the discharge commencement voltage, it is necessary to output further greater power from the high-frequency power device 1.

Although the output frequency may be adjusted so as to become the same as the resonance frequency if the resonance frequency exists in a variable range of the output frequency of the high-frequency power device 1, there may be a case where the resonance frequency does not exist in the variable range of the output frequency of the high-frequency power device 1. However, at this stage, it is not necessarily required that the output frequency of the high-frequency power device 1 is matched to the resonance frequency, it is sufficient that the voltage value applied to a load takes the highest frequency in the variable range of the output frequency of the high-frequency power device 1. Thus, if the output frequency of the high-frequency power device 1 differs from the resonance frequency, it becomes necessary that further greater power is output from the high-frequency power device 1 as described above. However, since the time is very slight, it does not bring about any problem.

(2) Immediately After Discharge is Commenced:

As discharge is commenced, the impedance of a load radically changes. As a result, frequency characteristics differing from those depicted in FIG. 2 are brought about. That is, since the load side impedance ZL also radically changes, the output frequency at which impedance is matched radically changes. Therefore, in this stage, it is important to match the impedance, quickly following a radical change in the impedance of the load. For this reason, discharge commencement is detected by monitoring the output signal of the discharge detecting unit 17, the frequency is changed to the output frequency, obtained in advance, at which the impedance is matched. Thus, by completing rough matching of impedance, it is possible to cope with a radical change in the load side impedance before and after commencement of discharge.

(3) Impedance Matching During Discharge:

Rough matching of impedance has been completed in section (2) described above. However, since the load impedance fluctuates in the case of a discharge load, the load side impedance ZL is not constant and repeats fluctuations at all times. Also, since the output frequency matched in section (2) is an output frequency obtained through simulations and experiments, etc., there may be cases where the output frequency is not actually an optimal output frequency. Therefore, during discharge, the frequency is not fixed at the output frequency matched in section (2), but may be changed to an optimal output frequency in compliance with the situations, thereby matching the impedance.

Figures 3, 4:
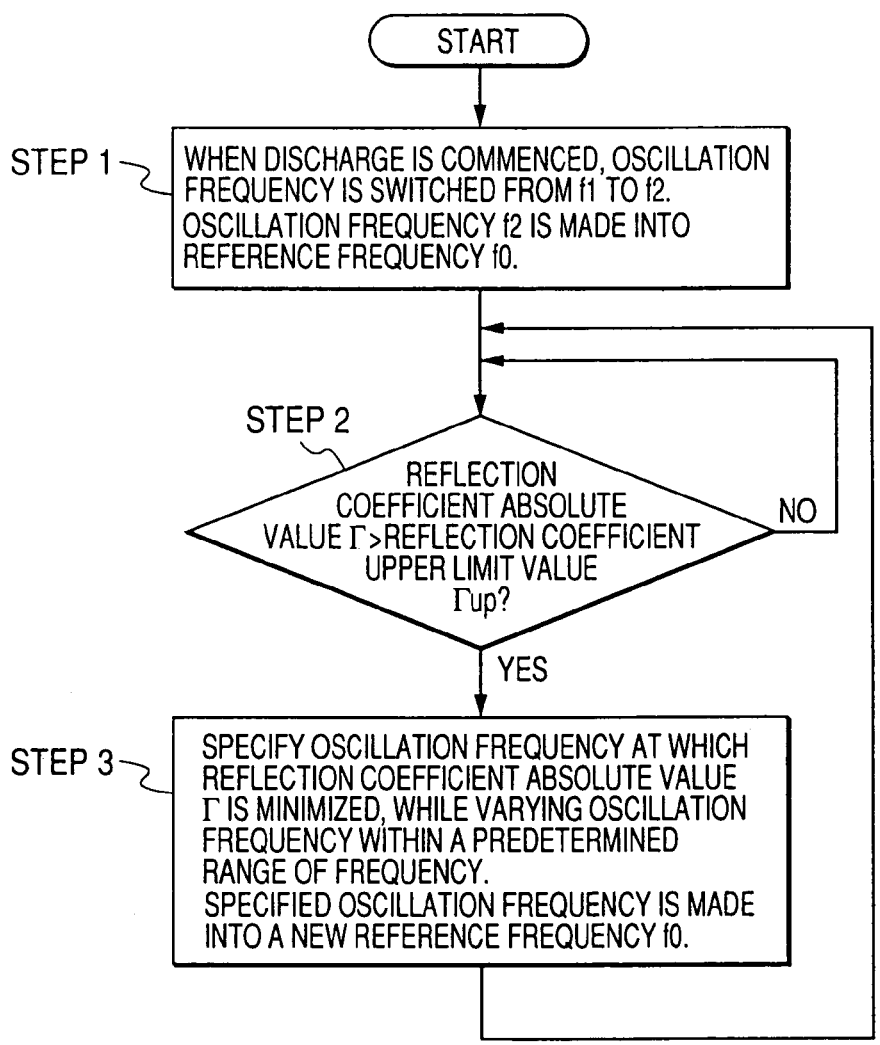
FIG. 3 is a flowchart depicting one example of a control method for matching of impedance during discharge after commencement of the discharge.
FIG. 4 shows an example of the reflection coefficient table 19, which depicts the relationship between the reflection coefficient absolute value $\Gamma$ and the reflection coefficient upper limit value $\Gamma$ up.

FIG. 3 is a flowchart depicting one example of a control method for matching the impedance during discharge after commencement of discharge. A description is given of matching of the impedance during discharge along the flowchart.

Also, in order to vary the output frequency of the high-frequency power device 1, it is sufficient that the oscillation frequency of the oscillation circuit 12 is varied. In the next description of Steps 1 through 3, for description of the detailed control method, a description is given of a change in the output frequency of the high-frequency power device 1, using the oscillation frequency of the oscillation circuit 12. In addition, this is the same for the other embodiments described later.

Step 1: As discharge is commenced in a plasma processing apparatus where the oscillation frequency before commencement of discharge is f1, and the oscillation frequency after commencement of discharge is f2, the frequency control circuit 11 gives an instruction to the oscillation circuit 12 so as to change the oscillation frequency from f1 to f2. By the discharge detecting unit 17, it is possible to detect whether or not discharge occurs, and further by inputting the detection signal into the frequency control circuit 11, it is possible to judge the discharge. Also, it is assumed that the oscillation frequency f2 is the reference frequency f0.

Step 2: Where the reflection coefficient absolute value $\Gamma$ in the reference frequency f0 exceeds the reflection coefficient upper limit value $\Gamma$ up in a state where high-frequency output is continued at the reference frequency f0 during discharge after commencement of the discharge, it is judged that the oscillation frequency is not adequate. And, the process advances to Step 3. Where the reflection coefficient absolute value $\Gamma$ is the reflection coefficient upper limit value $\Gamma$ up or less, Step 2 is repeated again. Further, the reflection coefficient upper limit value $\Gamma$ up is set to a value corresponding to the reflection coefficient absolute value $\Gamma$ at that time. As one example thereof, a description is given of a method by which the frequency control circuit 11 determines the reflection coefficient upper limit value $\Gamma$ up based on the relationship defined in the reflection coefficient table 19 with reference to the reflection coefficient table 19, as depicted in FIG. 4, in which the frequency control circuit 11 is separately determined.

FIG. 4 depicts one example of the reflection coefficient table 19 showing the relationship between the reflection coefficient absolute value $\Gamma$ and the reflection coefficient upper limit value $\Gamma$ up. The reflection coefficient table 19 depicted in FIG. 4 shows the reflection coefficient absolute values $\Gamma$ in the upper line and the reflection coefficient upper limit values $\Gamma$ up corresponding to the reflection coefficient absolute values $\Gamma$, respectively. The reflection coefficient upper limit values $\Gamma$ up corresponding to the reflection coefficient absolute values $\Gamma$ are determined based on the relationship. For example, where the reflection coefficient absolute values $\Gamma$ are 0.0 or more but less than 0.1, the reflection coefficient upper limit value $\Gamma$ up is determined to 0.1. Also, if the reflection coefficient absolute value $\Gamma$ exceeds 0.2, the reflection coefficient upper limit values $\Gamma$ up are set so that the upper limit values $\Gamma$ up are made smaller than the reflection coefficient absolute values $\Gamma$. This is because, where the impedance is regarded as not having matched (in this example, where the reflection coefficient absolute value $\Gamma$ exceeds 0.2), it is unconditionally judged that the oscillation frequency is not adequate at that time, in order to control so that the reflection coefficient absolute value is immediately made smaller, and the process is advanced to Step 3.

Also, where the reflection coefficient absolute value $\Gamma$ is comparatively small, the oscillation frequency is not always changed, and high-frequency is output at the oscillation frequency as it is until the reflection coefficient absolute value $\Gamma$ exceeds the frequency coefficient upper limit value $\Gamma$ up. This is because fluctuations of minute impedance are brought about since the impedance minutely changes at all times even in the case where discharge is comparatively stabilized in the case of a discharge load. That is, this is because of preventing such a phenomenon since the reflection coefficient absolute value $\Gamma$ fluctuating due to fluctuations of minute impedance, however, if the oscillation frequency is varied at all times in line with fluctuations of the reflection coefficient absolute value $\Gamma$, the discharge is made unstable on the contrary, resulting from a change in the oscillation frequency. Further, by varying the setting of the reflection coefficient table 19, it is possible to easily vary the degree of adjustment.

Also, the reason why the reflection coefficient upper limit value $\Gamma$ up is not a fixed value, but is varied in line with the reflection coefficient absolute value $\Gamma$ where the reflection coefficient absolute value $\Gamma$ is comparatively small is to prevent the reflection coefficient absolute value $\Gamma$ from becoming excessively large while preventing the discharge from becoming unstable. For example, in the example depicted in FIG. 4, where the reflection coefficient absolute value $\Gamma$ is 0.05, since the reflection coefficient absolute value $\Gamma$ is 0.0 or more but less than 0.1, the reflection coefficient absolute value $\Gamma$ is controlled to be reduced by varying the oscillation frequency when exceeding the upper limit value 0.10 established by the reflection coefficient upper limit value $\Gamma$ up. However, if the oscillation frequency is intended to be varied by changing the set value of the reflection coefficient table 19 when the reflection coefficient absolute value $\Gamma$ exceeds 0.20, an action to improve the state is delayed due to a worsening in the state of a load although the reflection coefficient absolute value $\Gamma$ increases. Accordingly, it is preferable that the reflection coefficient upper limit value $\Gamma$ up is established in association with the reflection coefficient absolute value $\Gamma$. However, since there is an advantage that the control is simplified if the reflection coefficient upper limit value $\Gamma$ up is made into a fixed value (for example, 0.2) without using the reflection coefficient table 19, a fixed value may be employed where there is no problem if the fixed value is established.

In addition, by setting a function to define the relationship between the reflection coefficient absolute value $\Gamma$ and the reflection coefficient upper limit value $\Gamma$ up without using the reflection coefficient table 19, the reflection coefficient upper limit value $\Gamma$ up corresponding to the reflection coefficient absolute value $\Gamma$ may be determined by the function.

Step 3: an oscillation frequency, at which the reflection coefficient absolute value $\Gamma$ output from the reflection coefficient calculating circuit 18 is minimized, is specified in the range of predetermined frequencies including the reference frequency f0 while varying the oscillation frequency. The specified oscillation frequency is made into a new reference frequency f0. After that, the process advances to Step 2, wherein the process is repeated.

The oscillation frequency in Step 3 may be varied by a method of gradually increasing the oscillation frequency or by a method of varying the same by a specified pattern. Also, it is preferable that a predetermined frequency range is established, wherein the minute frequency is $\Delta f$, the minimum oscillation frequency is $f0-\Delta f$, and the maximum oscillation frequency is $f0+\Delta f$. However, the predetermined frequency range is not limited thereto. Deviations in regard to the reference frequency f0 may differ in the minimum oscillation frequency and the maximum oscillation frequency. That is, the minute frequency $\Delta f1$ and the minute frequency $\Delta f2$ are made into different frequencies, wherein the minimum oscillation frequency may be made into $f0-\Delta f1$, and the maximum oscillation frequency may be made into $f0+\Delta f2$. In addition, the oscillation frequency f1, the oscillation frequency f2, and the minute frequency $\Delta f$ (also, $\Delta f1$ and $\Delta f2$ may be acceptable) are input into the frequency control circuit 11 as depicted in FIG. 1.

Herein, a description is given of a method for specifying an oscillation frequency at which the reflection coefficient absolute value $\Gamma$ is minimized, taking for instance a case where the minimum oscillation frequency in the predetermined frequency range is set to $f0-\Delta f$ and the maximum oscillation frequency therein is set to $f0+\Delta f$.

FIG. 5 is a view depicting the relationship between the oscillation frequency and the reflection coefficient absolute value $\Gamma$ where, as a predetermined frequency range including the reference frequency f0, the minimum oscillation frequency is set to $f0-\Delta f$, and the maximum oscillation frequency is set to $f0+\Delta f$. As depicted in FIG. 5, roughly five patterns (a) through (e) are provided.

In the case of (a), the minimum oscillation frequency $f0-\Delta f$ is made into an oscillation frequency at which the reflection coefficient absolute value $\Gamma$ is minimized.

In the case of (b), the maximum oscillation frequency $f0+\Delta f$ is made into an oscillation frequency at which the reflection coefficient absolute value $\Gamma$ is minimized.

In the case of (c), an oscillation frequency at which the reflection coefficient absolute value $\Gamma$ is minimized exists between the reference frequency f0 and the minimum oscillation frequency $f0-\Delta f$.

In the case of (d), an oscillation frequency at which the reflection coefficient absolute value $\Gamma$ is minimized exists between the reference frequency f0 and the maximum oscillation frequency $f0+\Delta f$.

In the case of (e), the reference frequency f0 is made into an oscillation frequency at which the reflection coefficient absolute value $\Gamma$ is minimized.

In any one of the cases (a) through (e) described above, an oscillation frequency at which the reflection coefficient absolute value $\Gamma$ is minimized is specified in a predetermined frequency range including the reference frequency f0, and the oscillation frequency is made into a new reference frequency f0. Thereafter, the process advances to Step 2, wherein the process is repeated.

In the cases of (a) through (d) described above, the reflection coefficient absolute value $\Gamma$ at a newly specified reference frequency f0 is smaller than the reflection coefficient absolute value $\Gamma$ at the reference frequency f0 at the commencement of Step 3. Therefore, by advancing to Step 2 again and repeating the process, it is expected that the reflection coefficient absolute value $\Gamma$ is made smaller and smaller. However, in the case of (e) described above, even if advancing to Step 2 and repeating the process, there is a possibility for the reflection coefficient absolute value $\Gamma$ to become no longer smaller. This state is either a state where the oscillation frequency is already stabilized with the impedance matched or a state where the impedance cannot be matched due to a failure that is, for example, occurrence of an abnormality. If the impedance is already matched, the processing may be continued as it is. However, in a state where the impedance could not be matched, there is a possibility that an abnormality occurs. Therefore, in the case of (e) described above, it may be judged that an abnormality occurs, and an abnormality signal may be output to the exterior. Also, in some cases, such a process may be carried out, by which supply of high-frequency power from the high-frequency power device 1 to a load is stopped.

Herein, a description is given of the reason why the oscillation frequency is varied in a predetermined frequency range including the reference frequency f0 in Step 3. Where the oscillation frequency is varied, there may be cases where the impedance of a load significantly changes even if the variation range of the oscillation frequency is narrow. For this reason, such a state may be brought about, where the discharge cannot be maintained since the voltage applied to the load is made excessively low, and the power volume supplied to the load is made excessively low on the basis of the oscillation frequency having been varied. Also, since the conditions of the load are radically varied, an adverse influence is given to a workpiece. In addition, in the case of a discharge load as described above, discharge minutely fluctuates even in a state where the discharge is comparatively stabilized, wherein the fluctuation may be instantaneously made large. In such a case, if the impedance is sensitively matched in line with the fluctuations, an adverse influence is rather brought about. Accordingly, it is preferable that, by narrowing the fluctuation width of the oscillation frequency as much as possible, the fluctuation of the impedance of a load accompanying a change in the oscillation frequency is made small. However, since a change in the oscillation frequency can be instantaneously carried out even if the fluctuation width of the oscillation frequency is narrowed, the impedance matching can be carried out at higher speed than in the conventional automatic matching unit employing a variable impedance element for which there is a limit in the actuation speed. Further, the fluctuation width of the oscillation frequency may be determined by executing tests in a real apparatus.

By thus controlling, it is possible to cope with a radical change in the load side impedance ZL before and after commencement of discharge and to cope with the subsequent impedance matching thereafter.

Embodiment 2

Figure 6:
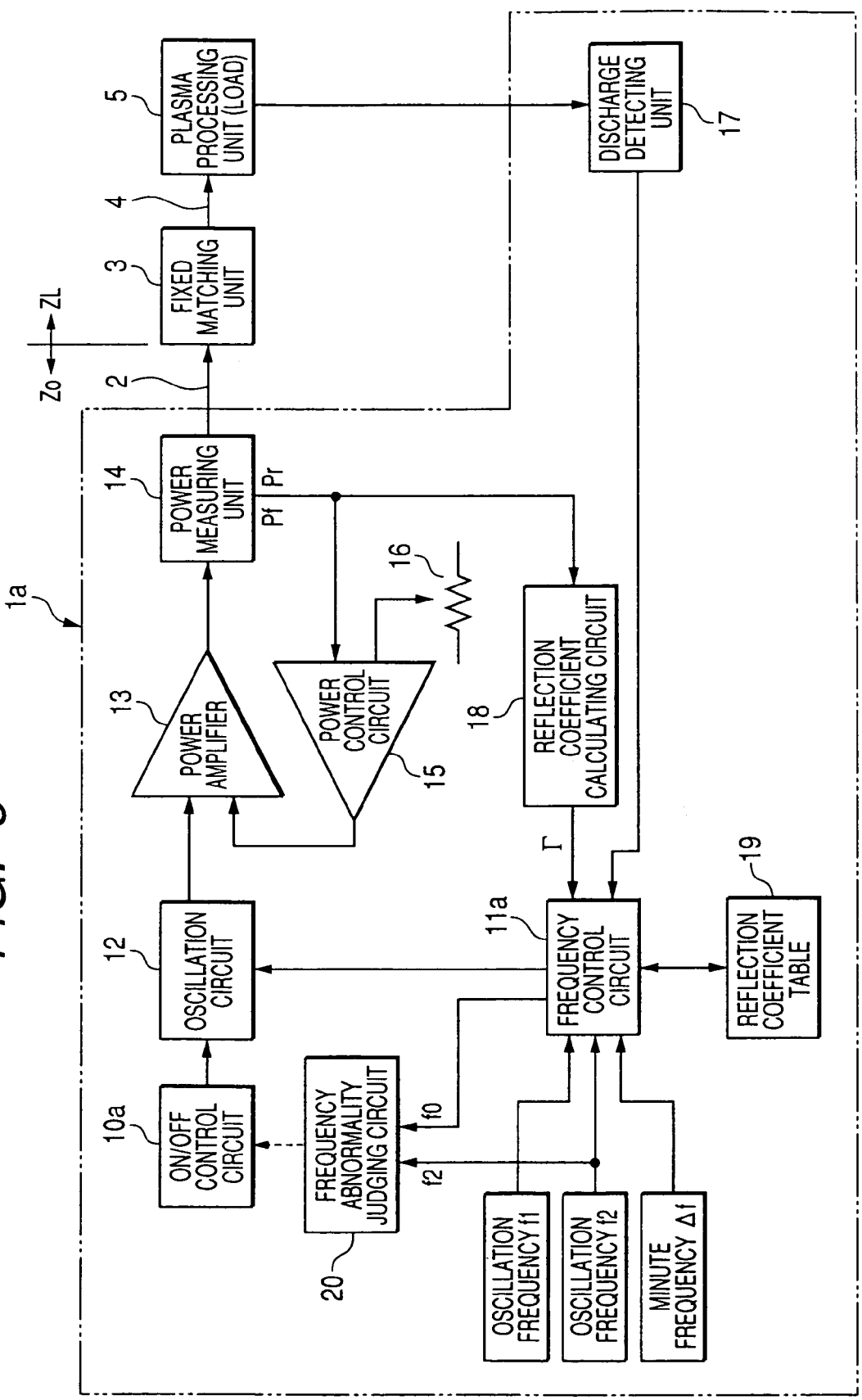
FIG. 6 is a view depicting a configuration of a high-frequency power device 1a according to Embodiment 2 of the invention and a connection between the high-frequency power device 1a, the fixed matching unit 3 and the load 5.

FIG. 6 is a view depicting a configuration of a high-frequency power device 1a according to Embodiment 2 of the invention and depicting a connection between the high-frequency power device 1a, a fixed matching unit 3 and a load 5. The high-frequency power device 1a depicted in FIG. 6 is such that a frequency abnormality judging circuit 20 is added to the high-frequency power device 1 depicted in FIG. 1, the ON/OFF control circuit 10 depicted in FIG. 1 is replaced by an ON/OFF control circuit 10a, and the frequency control circuit 11 depicted therein is also replaced by a frequency control circuit 11a. All others depicted in FIG. 6 are identical to those depicted in FIG. 1, and description thereof is omitted.

The frequency control circuit 11a has a function of outputting the reference frequency f0 at that time in addition to a function of the frequency control circuit 11 described in FIG. 1.

The oscillation frequency f2 and a specified oscillation frequency (reference frequency f0) at that time, which is output from the frequency control circuit 11a, are input into the frequency abnormality judging circuit 20, and the frequency abnormality judging circuit 20 calculates a deviation between the oscillation frequency f2 and the specified oscillation frequency (reference frequency f0), that is, |f2−f0|, and if the deviation is within a predetermined permissible frequency fp, it is judged to be normal and if the deviation exceeds the predetermined permissible frequency fp, the frequency is judged to be abnormal. Where it is judged to be abnormal, an abnormality is notified by outputting an abnormality signal to a notification device (not illustrated). Also, an abnormality signal may be output to an external unit. In some cases, an abnormality signal may be output to the ON/OFF control circuit 10a. Also, the frequency abnormality judging circuit 20 functions as means for judging frequency abnormality according to the invention.

In addition to the function of the ON/OFF control circuit 10 described in FIG. 1, the ON/OFF control circuit 10a has a function of stopping supply of high-frequency power from the high-frequency power device 1a to a load by stopping an output of an ON signal to the oscillation circuit 12 where an abnormality signal is output from the frequency abnormality judging circuit 20 to the ON/OFF control circuit 10a.

Herein, a description is given of the reason why judgement is carried out as described above by providing the frequency abnormality judging circuit 20.

The oscillation frequency f2 changed after commencement of discharge is a frequency which is obtained by simulations and experiments as described above. Therefore, there may be a case where the frequency is not an optimal oscillation frequency. Accordingly, during discharge, the frequency is not fixed at the oscillation frequency f2, but it is varied to an optimal oscillation frequency in compliance with the situations, wherein the impedance is matched. However, usually, the deviation between the oscillation frequency f2 and the optimal oscillation frequency is slight. For this reason, where the deviation between the oscillation frequency f2 and the optimal oscillation frequency is large, there is a high possibility that an abnormality occurs. For example, there is a possibility for the plasma state to have been changed, in comparison with the state immediately after the interior of a plasma processing apparatus is cleaned up, based on the interior of the plasma processing apparatus which becomes a load being contaminated, or a possibility for the plasma state having been changed due to the gas flow being reduced below a predetermined value by a failure of the apparatus. In such cases, since it is preferable to take a countermeasure, for example, stopping supply of high-frequency power from the high-frequency power device 1a to a load, in compliance with the situations, an abnormality signal is output from the frequency abnormality judging circuit 20, such a countermeasure suitable for the situations can be taken.

Figure 7:
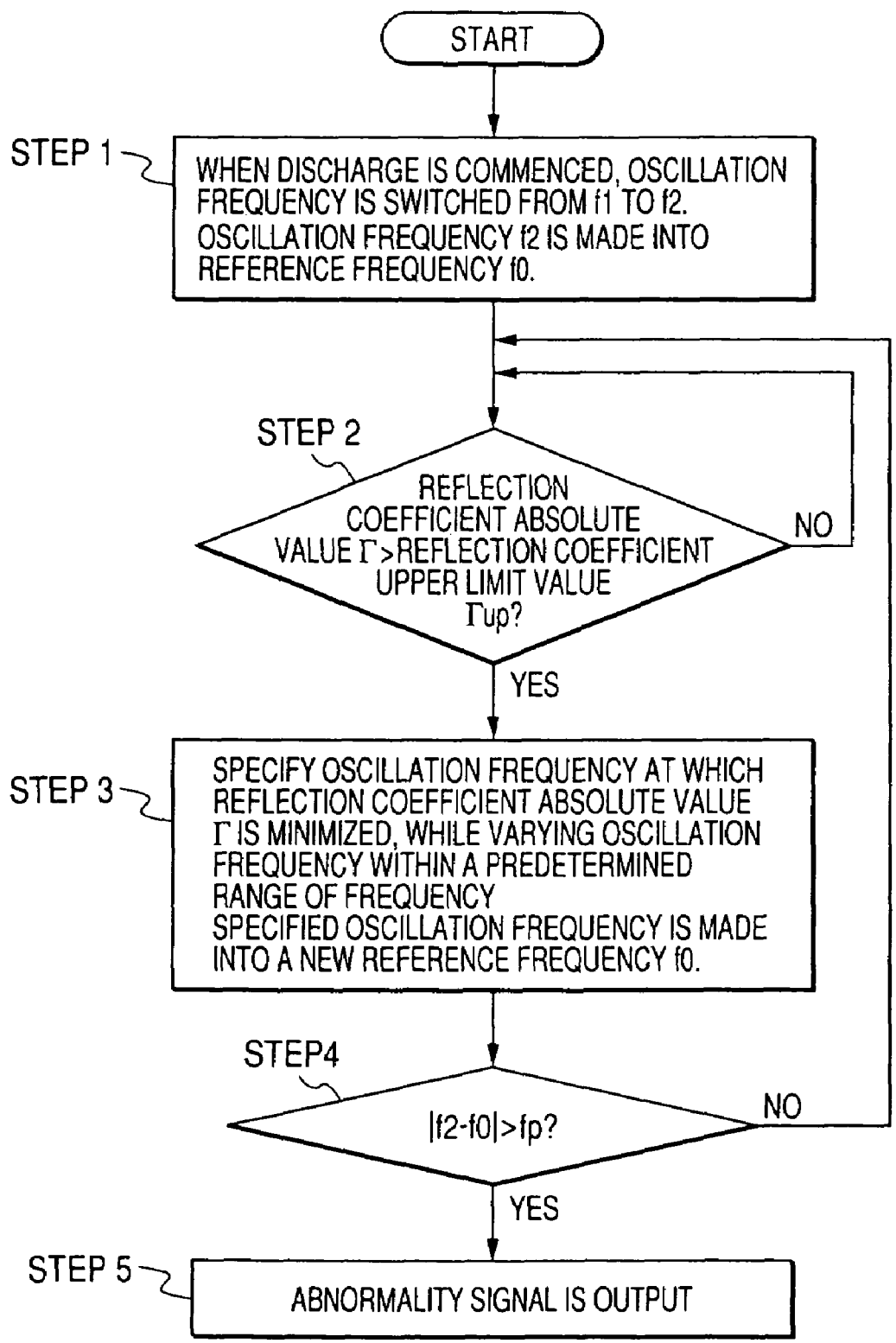
FIG. 7 is a flowchart depicting one example of a control method for matching of impedance during discharge after commencement of the discharge, using the high-frequency power device 1a depicted in FIG. 6.

FIG. 7 is a flowchart depicting one example of a control method for matching impedance during discharge after commencement of the discharge, using the high-frequency power device 1a depicted in FIG. 6. A description is given of matching of the impedance during discharge along the flowchart.

Steps 1 through 3 are the same as those in FIG. 3. However, the steps after Step 3 are different from those in FIG. 3, wherein the process advances to Step 4.

Step 4:
The frequency abnormality judging circuit 20 calculates a deviation between the oscillation frequency f2 and a specified oscillation frequency (reference frequency f0) at that time, which is output from the frequency control circuit 11a, that is, |f2−f0|. When the deviation is within a predetermined permissible frequency fp, the frequency is judged to be normal, and the process advances to Step 2, and the process is repeated. However, where the deviation exceeds the predetermined permissible frequency fp, the frequency is judged to be abnormal, wherein the process advances to Step 5, and an abnormality signal is output.

By thus controlling, it becomes possible to detect an abnormality in addition to the functions of the high-frequency power device according to Embodiment 1.

Embodiment 3

Figure 8:
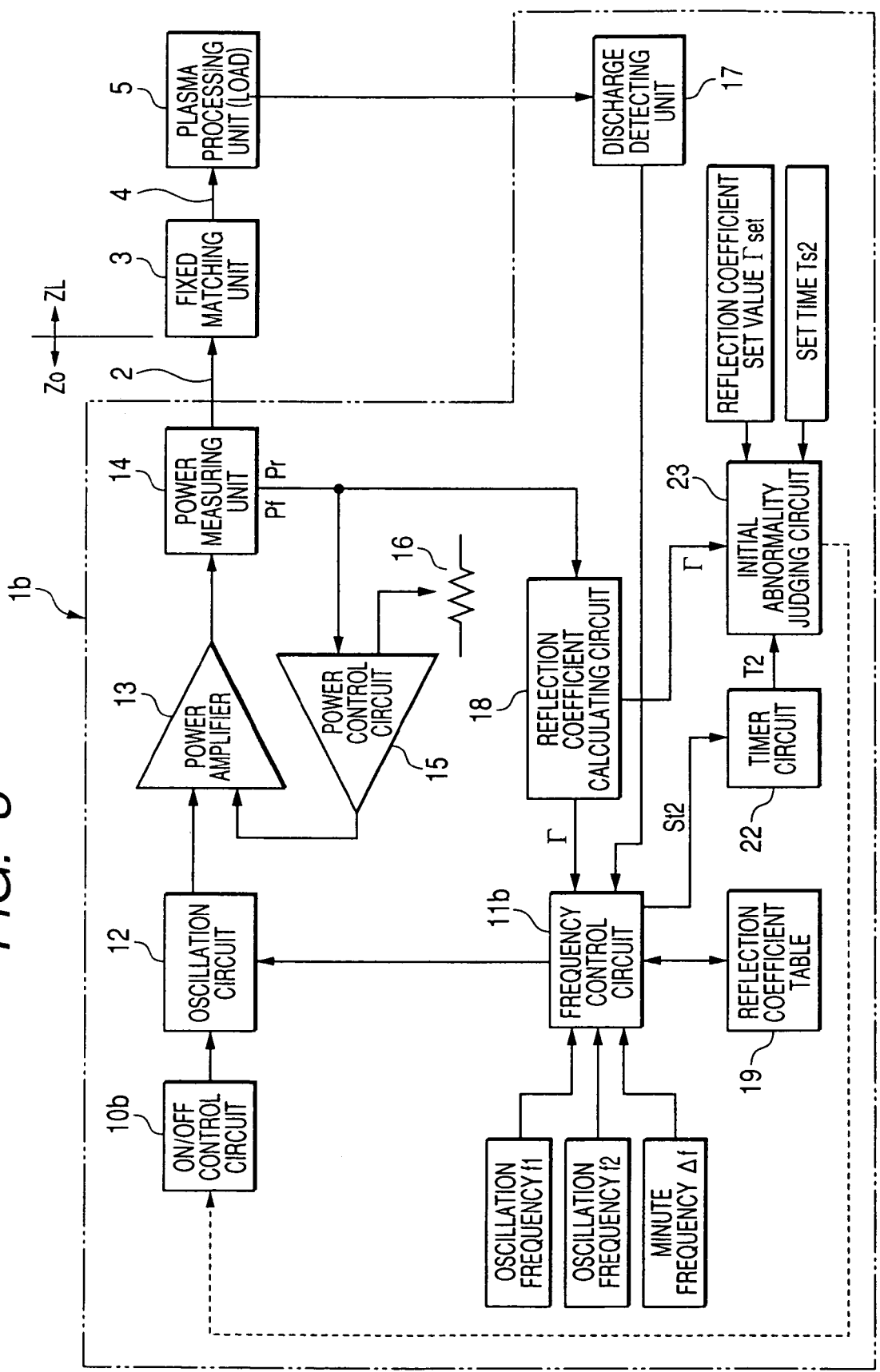
FIG. 8 is a view depicting a configuration of a high-frequency power device 1b according to Embodiment 3 of the invention and a connection between the high-frequency power device 1b, the fixed matching unit 3 and the load 5.

FIG. 8 is a view depicting a configuration of a high-frequency power device 1b according to Embodiment 3 of the invention and depicting a connection between the high-frequency power device 1b, the fixed matching unit 3 and the load 5. The high-frequency power device 1b depicted in FIG. 8 is such that a timer circuit 22 for measuring the time after the frequency is changed and an initial abnormality judging circuit 23 are added to the high-frequency power device 1a depicted in FIG. 6, the ON/OFF control circuit 10a depicted in FIG. 6 is replaced by an ON/OFF control circuit 10b, and also the frequency control 11a is replaced by a frequency control circuit 11b. The others depicted in FIG. 8 are identical to those depicted in FIG. 6, and description thereof is omitted.

The high-frequency control circuit 11b has a function of outputting a trigger signal St2 when an instruction is given to change the oscillation frequency f1 to f2, in addition to the function of the frequency control circuit 11a described in FIG. 6.

The timer circuit 22 measures the time T2 elapsed after a trigger signal St2 output from the frequency control circuit 11b is input, and outputs the measurement time T2. In addition, the timer circuit 22 and the timer circuit 22f described later function as means for measuring time after instruction of frequency according to the invention.

The reflection coefficient absolute value Γ output from the reflection coefficient calculating circuit 18, the measurement time T2 output from the timer circuit 22, a predetermined reflection coefficient set value Γset, and a predetermined set time Ts2 are input into the initial abnormality judging circuit 23, wherein the initial abnormality judging circuit 23 has a function of judging it to be abnormal in a case where the reflection coefficient absolute value Γ does not become the reflection coefficient set value Γ set or less until the measurement time T2 reaches the predetermined set time Ts2. Where it is judged to be abnormal, an abnormality signal is output to a notification device (not illustrated), thereby notifying the abnormality. Further, the abnormality signal may be output to an external unit. In some cases, the abnormality signal may be output to the ON/OFF control circuit 10b. In addition, the initial abnormality judging circuit 23 and an initial abnormality judging circuit 23f described later function as means for judging initial abnormality according to the invention.

The ON/OFF control circuit 10b has a function of stopping supply of high-frequency power from the high-frequency power device 1b to a load by stopping output of an ON signal to the oscillation circuit 12 where an abnormality signal is output from the initial abnormality judging circuit 23 to the ON/OFF control circuit 10b, in addition to the function of the ON/OFF control circuit 10a described in FIG. 6.

If the initial abnormality judging circuit 23 is thus provided, at the beginning of the process from the time when an instruction is changed to switch the oscillation frequency from f1 to f2 to the time when a predetermined set time Ts2 is reached, it is possible to detect an abnormality when an abnormality occurs, as in Embodiment 2 described above. Therefore, a countermeasure such as, for example, stopping supply of high-frequency power from the high-frequency power device 1b to a load, may be taken.

Figure 9:
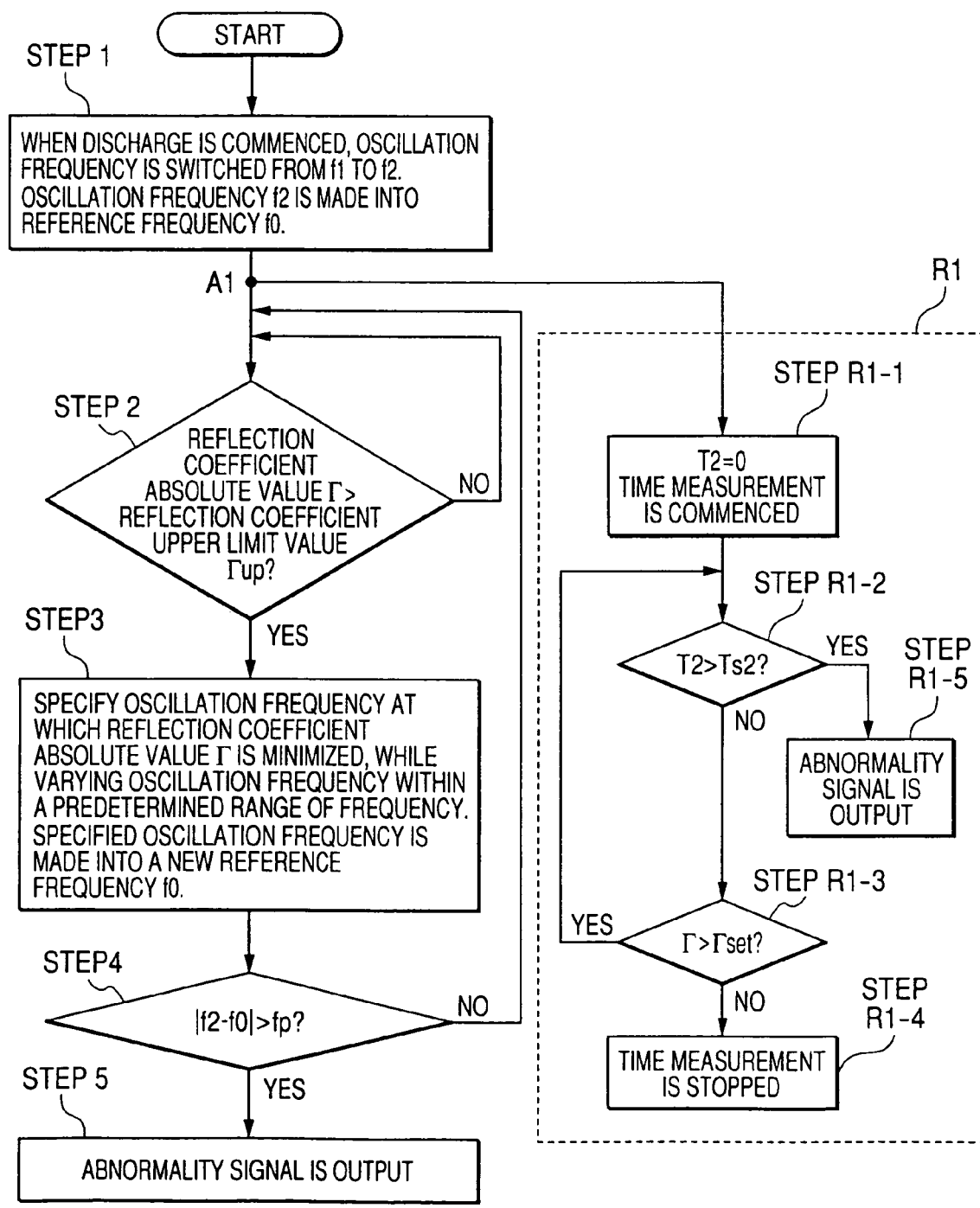
FIG. 9 is a flowchart depicting one example of a control method for matching of impedance during discharge after commencement of the discharge, using the high-frequency power device 1b depicted in FIG. 8.

FIG. 9 is a flowchart depicting one example of a control method for matching impedance during discharge after the discharge is commenced, using the high-frequency power device 1b depicted in FIG. 8. A description is given of matching of impedance during discharge along the flowchart.

Steps 1 through 5 are identical to those in the flowchart of FIG. 7. However, a branching point A1 is provided between Step 1 and Step 2, wherein after Step 1, the process advances to Step 2 and, at the same time, advances to an initial abnormality judging routine R1 enclosed by a dashed line. A description of Steps 1 through 5 is omitted. A description is given of Steps R1-1 through R1-5 in the initial abnormality judging routine R1.

Step R1-1: When a trigger signal St2 is output from the frequency control circuit 11b, the measurement time T2 is set to its initial state T2=0 in the timer circuit 22. After that, time measurement is commenced.

Step R1-2: In the initial abnormality judging circuit 23, it is judged whether or not the measurement time T2 output from the timer circuit 22 is larger than the predetermined set time Ts2. Where T2>Ts2 is not brought about, the process advances to Step R1-3, and in a case of T2>Ts2, the process advances to Step R1-5. At the beginning, since NO is provided, the process advances to Step R1-3.

Step R1-3: In the initial abnormality judging circuit 23, it is judged whether or not the reflection coefficient absolute value $\Gamma$ output from the reflection coefficient calculating circuit 18 is larger than the predetermined reflection coefficient set value $\Gamma$ set. Where $\Gamma$>$\Gamma$ set is not brought about, the process advances to Step R1-4. In a case of $\Gamma$>$\Gamma$ set, the process returns to Step R1-2, and the processing is repeated.

Step R1-4: Where the process advances to Step R1-4, it is judged that no abnormality is detected at the beginning of the process, wherein the time measurement in the timer circuit 22 is stopped.

Step R1-5: Where the process advances to Step R1-5, it is judged that an abnormality occurs at the beginning of a process from the time when an instruction is changed so as to change the oscillation frequency from f1 to f2 to the time when the predetermined set time Ts2 is reached, and an abnormality signal is output.

By thus controlling, abnormality detection is enabled at the beginning of the process, in addition to the function of the high-frequency power device according to Embodiment 2.

Embodiment 4

Figure 10:
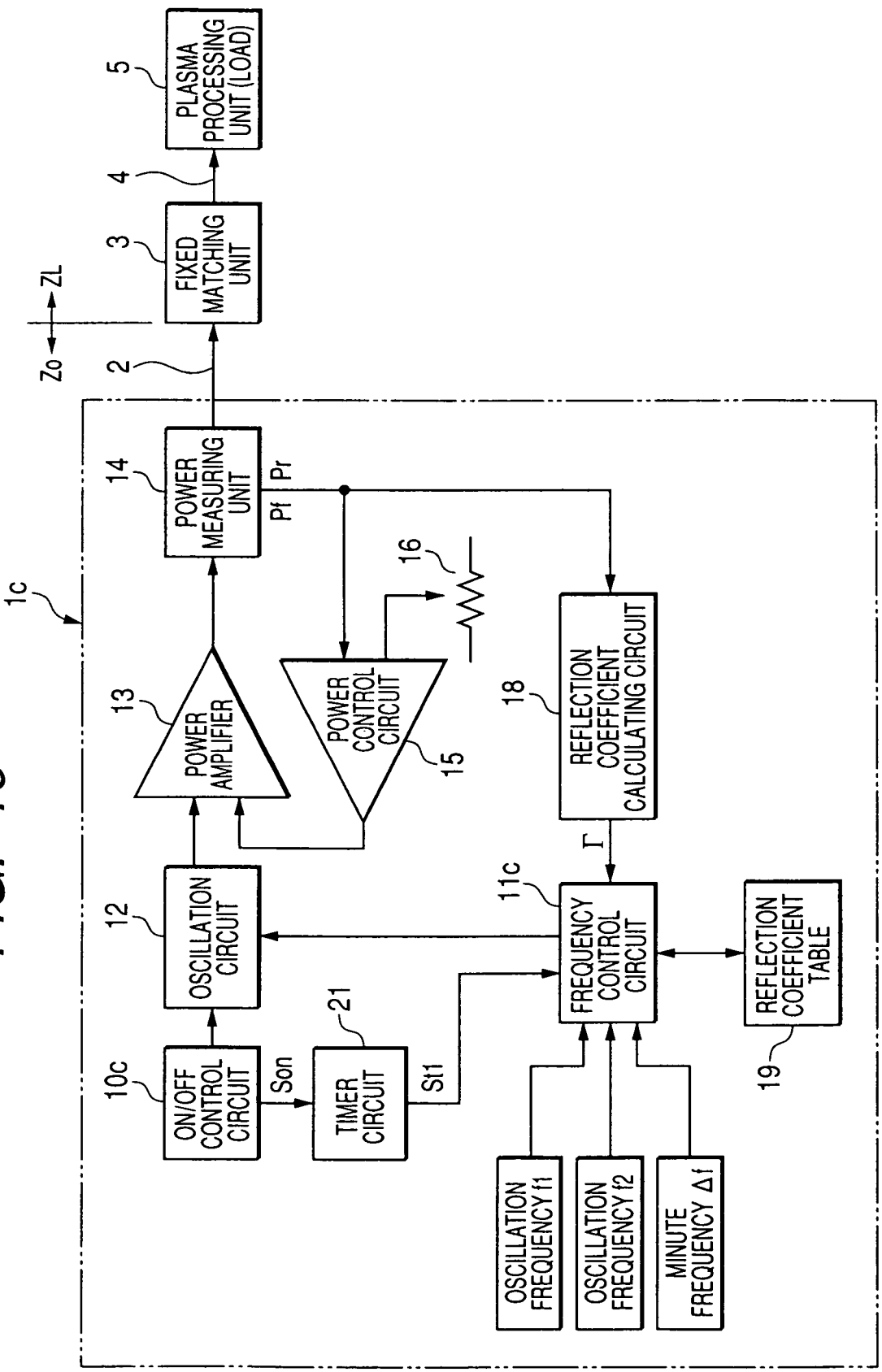
FIG. 10 is a view depicting a configuration of a high-frequency power device 1c according to Embodiment 4 of the invention and a connection between the high-frequency power device 1c, the fixed matching unit 3 and the load 5.

FIG. 10 is a view depicting a configuration of a high-frequency power device 1c according to Embodiment 4 of the invention and a connection between the high-frequency power device 1c, the fixed matching unit 3 and the load 5. The high-frequency power device 1c depicted in FIG. 10 is such that it is provided with a timer circuit 21 instead of the discharge detecting unit 17, omitting the discharge detecting unit 17 in the high-frequency power device 1 depicted in FIG. 1, and the frequency control circuit 11 depicted in FIG. 1 is replaced by the frequency control circuit 11c. The others depicted in FIG. 10 are identical to those in FIG. 1.

The ON/OFF control circuit 10c has a function of outputting a signal Son, which indicates that an ON signal is output, to a timer circuit 21 described later, when the ON signal is output to the oscillation circuit 12, in addition to the function of the ON/OFF control circuit 10 described in FIG. 1.

The timer circuit 21 measures the time elapsed after a high-frequency is output from the power amplifier 13 and supply of high-frequency power is commenced to a load. Further, the timer circuit 21 stores a predetermined discharge estimation time and outputs a trigger signal St1 when the measurement time reaches the predetermined discharge estimation time. In addition, the timer circuit 21 functions as means for outputting a discharge signal and means for measuring time after commencement of supply according to the invention.

Also, a signal Son indicating that an ON signal is output from the ON/OFF control circuit 10c to the oscillation circuit 12 is input in the timer circuit 21 of the example depicted in FIG. 10, and the timer circuit 21 measures the time elapsed after the signal Son is input. As described above, as the ON signal is output from the ON/OFF control circuit 10c, a high-frequency signal is output from the oscillation circuit 12. As a result, since a high frequency is output from the power amplifier 13 and high-frequency power is supplied to a load, it is not necessary to detect at the stage coming after the power amplifier 13 whether or not supply of high-frequency power is commenced, as in the example depicted in FIG. 10, it is possible to detect, by the signal Son output from the ON/OFF control circuit 10c, whether or not supply of high-frequency power is commenced.

Also by monitoring the forward wave power measurement value output from the power measuring unit 14, it is possible to judge whether or not supply of high-frequency power is commenced. In this case, a forward wave power measurement value Pf is input in the timer circuit 21 instead of the signal Son, and when the forward wave power measurement value Pf becomes larger than the reference value (usually 0), it may be judged that supply of high-frequency power is commenced.

Furthermore, the predetermined discharge estimation time is such that the time from commencement of supply of high-frequency power from the high-frequency power supplier to a load to commencement of discharge is estimated based on the data obtained by experiments, etc. Usually, since the time from commencement of supply of high-frequency power to a load to commencement of discharge is substantially constant under the same conditions, based on whether or not the discharge estimation time is reached, it is possible to estimate whether or not the discharge is commenced. For this reason, when the discharge estimation time is reached, it can be regarded as discharge having been commenced.

When the trigger signal St1 is output from the timer circuit 21, the frequency control circuit 11c judges that discharge occurred. The frequency control circuit 11c is different from the frequency control circuit 11 at this point.

Also, in the example depicted in FIG. 10, it is judged by means of the timer circuit 21 whether or not a predetermined discharge estimation time is reached. However, the judgment is not limited to this pattern. For example, the timer circuit 21 may output the time when measurement is carried out, and the frequency control circuit 11c may judge whether or not the discharge estimation time is reached.

Next, a description is given of an action in a case where high-frequency power is supplied to the load 5, using the above-described high-frequency power device 1c.

(1) Until Discharge Occurs:

High-frequency power is output from the high-frequency power device 1c and is supplied to the load 5, and voltage exceeding the discharge commencement voltage is applied to a gas in a plasma processing apparatus which becomes the load 5. Then, discharge is commenced. Since this section is identical to that of Embodiment 1 depicted in FIG. 1, description thereof is omitted.

(2) Immediately After Discharge is Commenced:

As discharge is commenced, the impedance of a load radically changes. As a result, frequency characteristics differing from the frequency characteristics as shown in FIG. 2 are brought about. That is, since the load side impedance ZL also radically changes, the output frequency at which the impedance is matched radically changes. Therefore, at this stage, it is important that the impedance is matched, quickly following a radical change in the impedance of the load. For this reason, by monitoring the trigger signal St1 output from the timer circuit 21, it is detected (presumed) whether or not the discharge is commenced, and the frequency may be changed to a predetermined output frequency at which the impedance is matched. Thus, by roughly matching the impedance, it is possible to cope with a radical change in the load side impedance before and after commencement of discharge.

(3) Impedance Matching During Discharge:

With respect to the impedance matching during discharge, as in Embodiment 1 depicted in FIG. 1, although rough impedance matching has been roughly completed in section (2) described above, since the impedance of a load fluctuates in the case of a discharge load, the load side impedance ZL is not constant, and the impedance always repeats fluctuation. Also, since the output frequency matched in section (2) is an output frequency obtained through simulations and experiments, etc., actually, there may be a case where the frequency is not an optimal output frequency. Therefore, during discharge, the frequency is not fixed at the output frequency matched in section (2), but it may be changed to an optimal output frequency in compliance with the situations for impedance matching.

Figure 11:
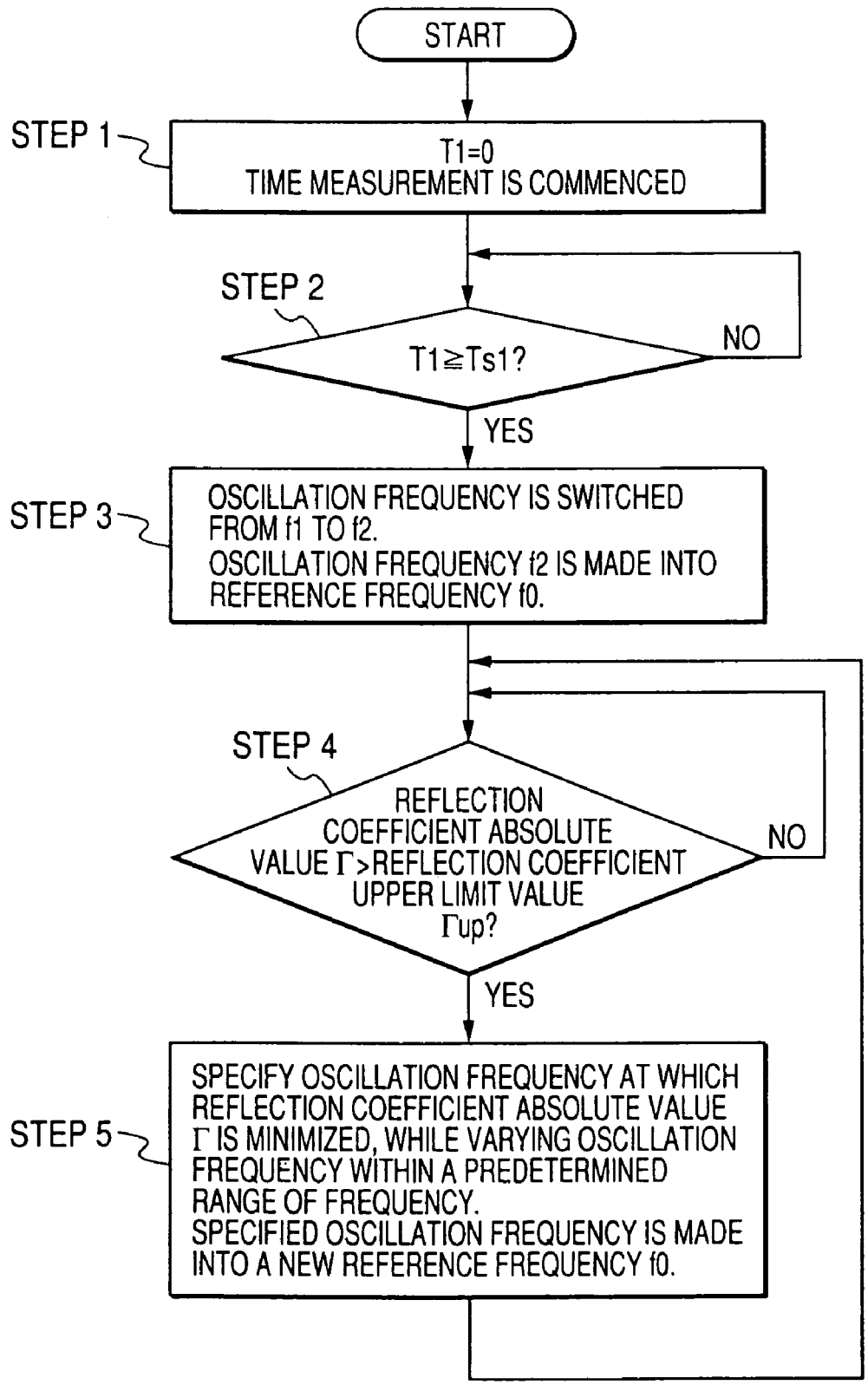
FIG. 11 is a flowchart depicting one example of a control method for matching of impedance during discharge after commencement of the discharge.

FIG. 11 is a flowchart depicting one example of a control method for matching impedance during discharge after commencement of the discharge. A description is given of impedance matching during discharge along the flowchart.

In addition, Steps 4 through 5 are similar to Steps 2 through 3 of the flowchart of Embodiment 1 described in FIG. 3. That is, Step 1 of the flowchart of FIG. 3 is replaced by Steps 1 through 3 of the flowchart of FIG. 11, and Steps 2 and 3 of the flowchart of FIG. 3 are put back to Steps 4 and 5, whereby the flowchart of FIG. 11 is brought about.

Step 1: When a signal Son is output from the ON/OFF control circuit 10, the measurement time is set to its initial state T1=0 in the timer circuit 21. After that, the time measurement is commenced.

Step 2: It is judged whether or not the measurement time T1 reaches a predetermined discharge estimation time Ts1. When the measurement time T1 showing the measurement time does not reach the discharge estimation time Ts1, Step 2 is repeated again. When the measurement time T1 reaches the discharge estimation time Ts1, it is estimated that the discharge is commenced, and the process advances to Step 3.

Step 3: It is estimated that discharge is commenced in a plasma processing apparatus where the oscillation frequency before commencement of discharge is made into f1 and the oscillation frequency after commencement of discharge is made into f2, and the frequency control circuit 11c gives an instruction to the oscillation circuit 12 to switch the oscillation frequency from f1 to f2. Also, the oscillation frequency f2 is made into the reference frequency f0.

Step 4: Since this step is similar to Step 2 of the flowchart of FIG. 3, a description thereof is omitted.

Step 5: Since this step is similar to Step 3 of the flowchart of FIG. 3, a description thereof is omitted.

By thus controlling, it becomes possible to cope with a radical change in the load side impedance ZL before and after commencement of discharge, and it is also possible to cope with subsequent impedance matching.

Embodiment 5

Figure 12:
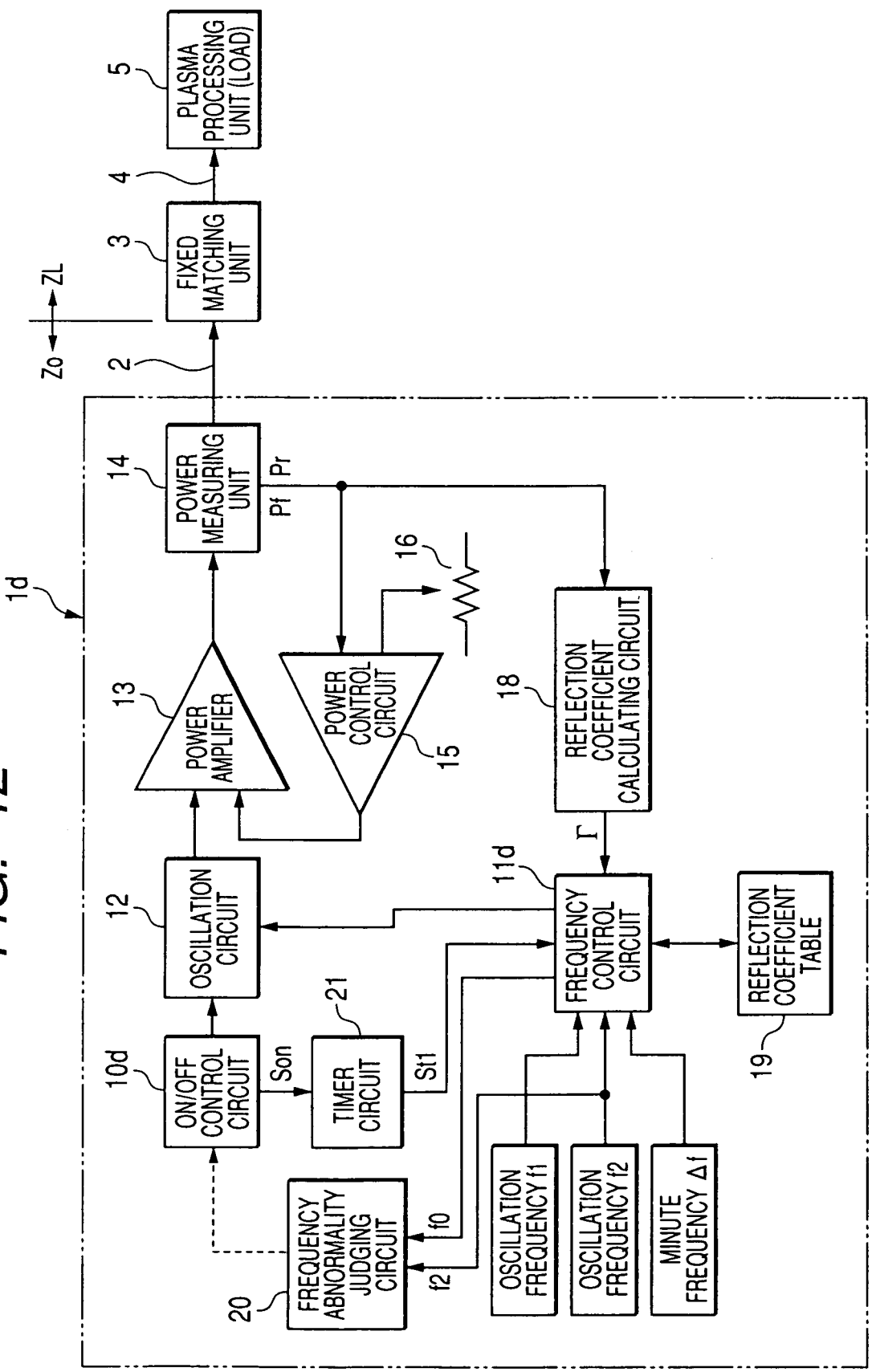
FIG. 12 is a view depicting a configuration of a high-frequency power device 1d according to Embodiment 5 of the invention and a connection between the high-frequency power device 1d, the fixed matching unit 3 and the load 5.

FIG. 12 is a view depicting a configuration of a high-frequency power device 1d according to Embodiment 5 of the invention and a connection between the high-frequency power device 1d, the fixed matching unit 3 and the load 5. The high-frequency power device 1d depicted in FIG. 12 is such that a frequency abnormality judging circuit 20 is added to the high-frequency power device 1c depicted in FIG. 10, the ON/OFF control circuit depicted in FIG. 10 is replaced by an ON/OFF control circuit 10d, and the frequency control circuit 11c is replaced by a frequency control circuit 11d. In addition, since the frequency abnormality judging circuit 20 is similar to that depicted in FIG. 6, a description thereof is omitted. Also, since the others depicted in FIG. 12 are identical to those depicted in FIG. 10, a description thereof is omitted.

The frequency control circuit 11d has a function of outputting a reference frequency f0 at that time in addition to the function of the frequency control circuit 11c described in FIG. 10.

The ON/OFF control circuit 10d has a function of stopping supply of high-frequency power from the high-frequency power device 1d to a load by stopping output of an ON signal to the oscillation load 12, where an abnormality signal is output from the frequency abnormality judging circuit 20 to the ON/OFF control circuit 10d, in addition to the function of the ON/OFF control circuit 10c described in FIG. 10.

Figure 13:
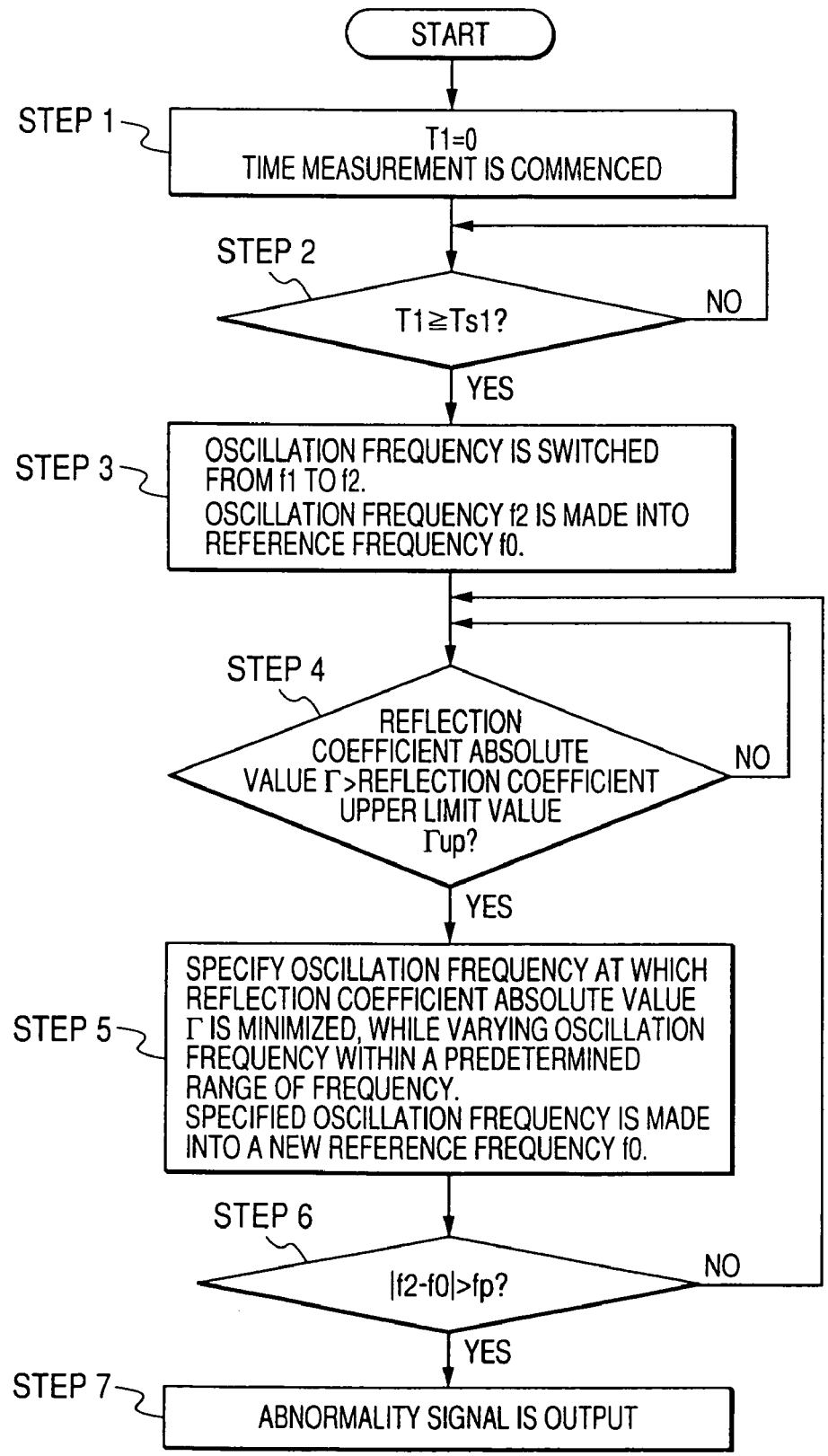
FIG. 13 is a flowchart depicting one example of a control method for matching of impedance during discharge after commencement of the discharge, using the high-frequency power device 1d depicted in FIG. 12.

FIG. 13 is a flowchart depicting one example of a control method for matching impedance during discharge after commencement of discharge, using the high-frequency power device 1d depicted in FIG. 12. A description is given of matching of impedance during discharge along the flowchart.

Steps 1 through 5 are identical to those of FIG. 11. However, Steps after Step 5 are different from FIG. 11, wherein the process advances to Step 6.

Step 6: The frequency abnormality judging circuit 20 calculates a deviation between the oscillation frequency f2 and a specified frequency (reference frequency f0) at that time, which is output from the frequency control circuit 11d, that is, |f2−f0|. It is judged to be normal where the deviation is within a predetermined permissible frequency fp, and the process advances Step 4, and repeats it. However, where the deviation exceeds the predetermined permissible frequency fp, it is judged to be abnormal, wherein the process advances to Step 7 and an abnormality signal is output.

By thus controlling, it becomes possible to detect an abnormality in addition to the function of the high-frequency power device according to Embodiment 1.

Embodiment 6

Figure 14:
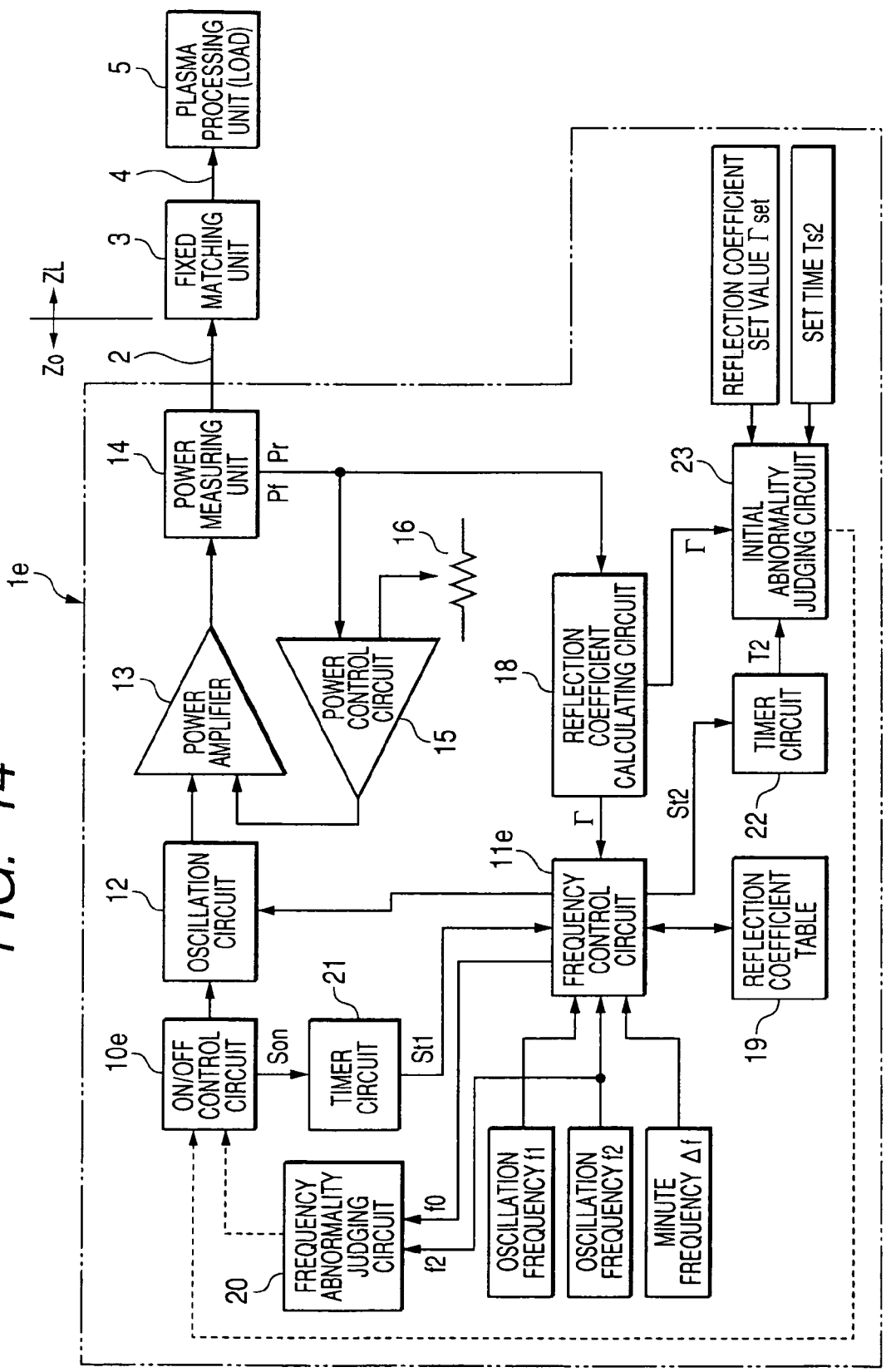
FIG. 14 is a view depicting a configuration of a high-frequency power device 1e according to Embodiment 6 of the invention and a connection between the high-frequency power device 1e, the fixed matching unit 3 and the load 5.

FIG. 14 is a view depicting a configuration of a high-frequency power device 1e according to Embodiment 6 of the invention and a connection between the high-frequency power device 1e, the fixed matching unit 3 and the load 5. The high-frequency power device 1e depicted in FIG. 14 is such that a timer circuit 22 for measuring the time elapsed after change of frequency and an initial abnormality judging circuit 23 are added to the high-frequency power device 1d depicted in FIG. 12, the ON/OFF control circuit 10d depicted in FIG. 12 is replaced by an ON/OFF control circuit 10e, and the frequency control circuit 11d is replaced by a frequency control circuit 11e. Also, since the timer circuit 22 and the initial abnormality judging circuit 23 are similar to those of FIG. 8, a description thereof is omitted. Further, since the others depicted in FIG. 14 are identical to those of FIG. 12, a description thereof is also omitted.

The frequency control circuit 11e has a function of outputting a trigger signal St2 when an instruction is given to the oscillation circuit 12 so as to change the oscillation frequency from f1 to f2, in addition to the function of the frequency control circuit 11d described in FIG. 12.

The ON/OFF control circuit 10e has a function of stopping supply of high-frequency power from the high-frequency power device 1e to a load by stopping output of an ON signal to the oscillation circuit 12 where an abnormality signal is output from the initial abnormality judging circuit 23 to the ON/OFF control circuit 10d in addition to the function of the ON/OFF control circuit 10d described in FIG. 12.

As in Embodiment 3, if the initial abnormality judging circuit 23 is provided, an abnormality can be detected, as in Embodiment 3, when an abnormality occurs at the beginning of the process from the time when an instruction is changed so as to switch the oscillation frequency from f1 to f2 to the time when the predetermined set time Ts2 is reached. Therefore, it is possible to take a countermeasure in compliance with the situations, for example, stopping supply of high-frequency power from the high-frequency power device 1b to a load.

Figure 15:
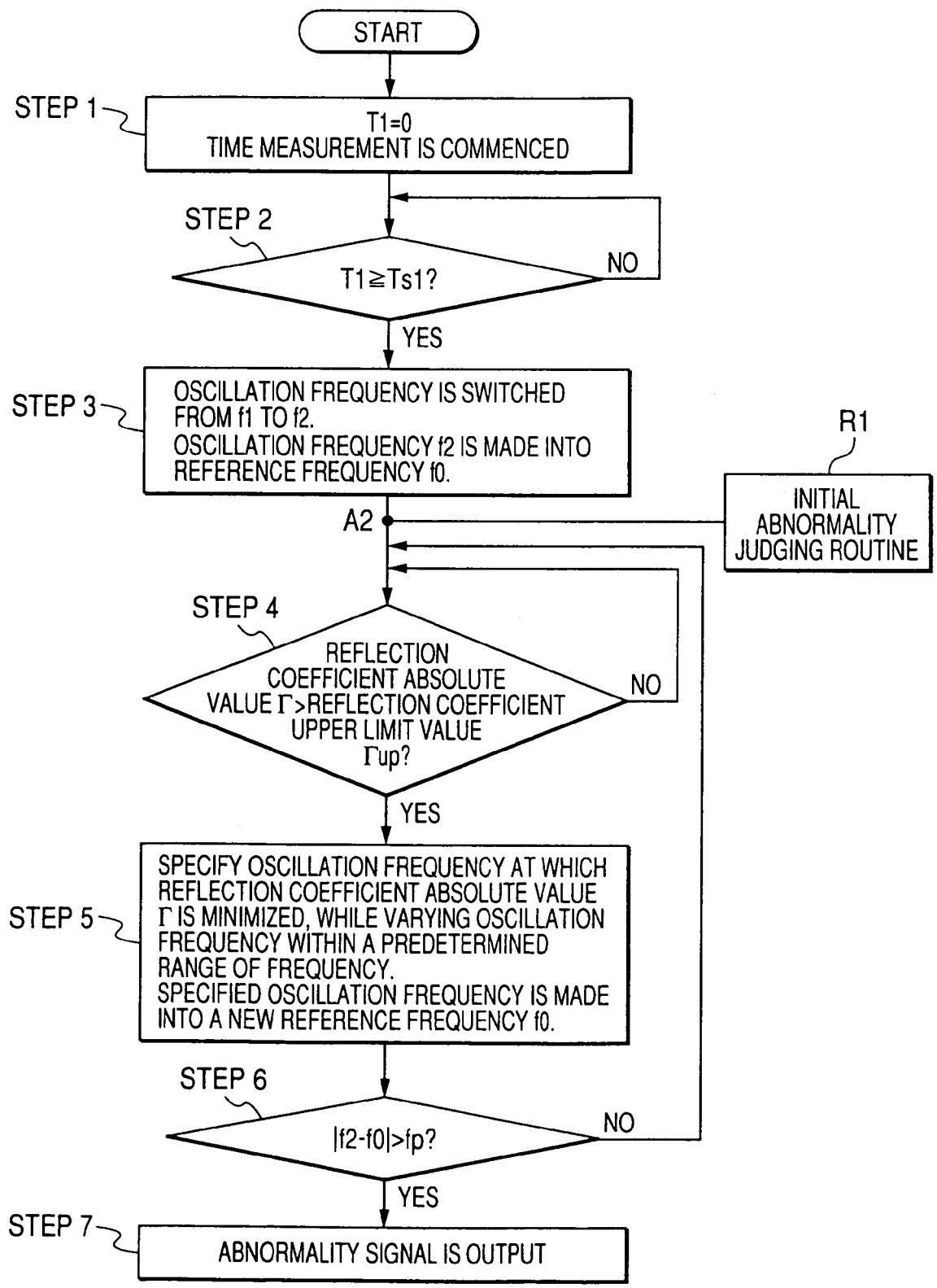
FIG. 15 is a flowchart depicting one example of a control method for matching of impedance during discharge after commencement of the discharge, using the high-frequency power device 1e depicted in FIG. 14.

FIG. 15 is a flowchart depicting one example of a control method for matching impedance during discharge after commencement of the discharge, using the high-frequency power device 1e depicted in FIG. 14. A description is given of matching of the impedance during discharge along the flowchart.

The flowchart is a flowchart in which a branch point A2 is provided between Step 3 and Step 4 in the flowchart of FIG. 13, and the initial abnormality judging routine R1 described in FIG. 9 of Embodiment 3 is connected to Step 3. Therefore, in addition to the function of the high-frequency power device according to Embodiment 5, an abnormality can be detected at the beginning of the process. Since the initial abnormality judging routine R1 is described above, a description thereof is omitted.

Embodiment 7

Figure 16:
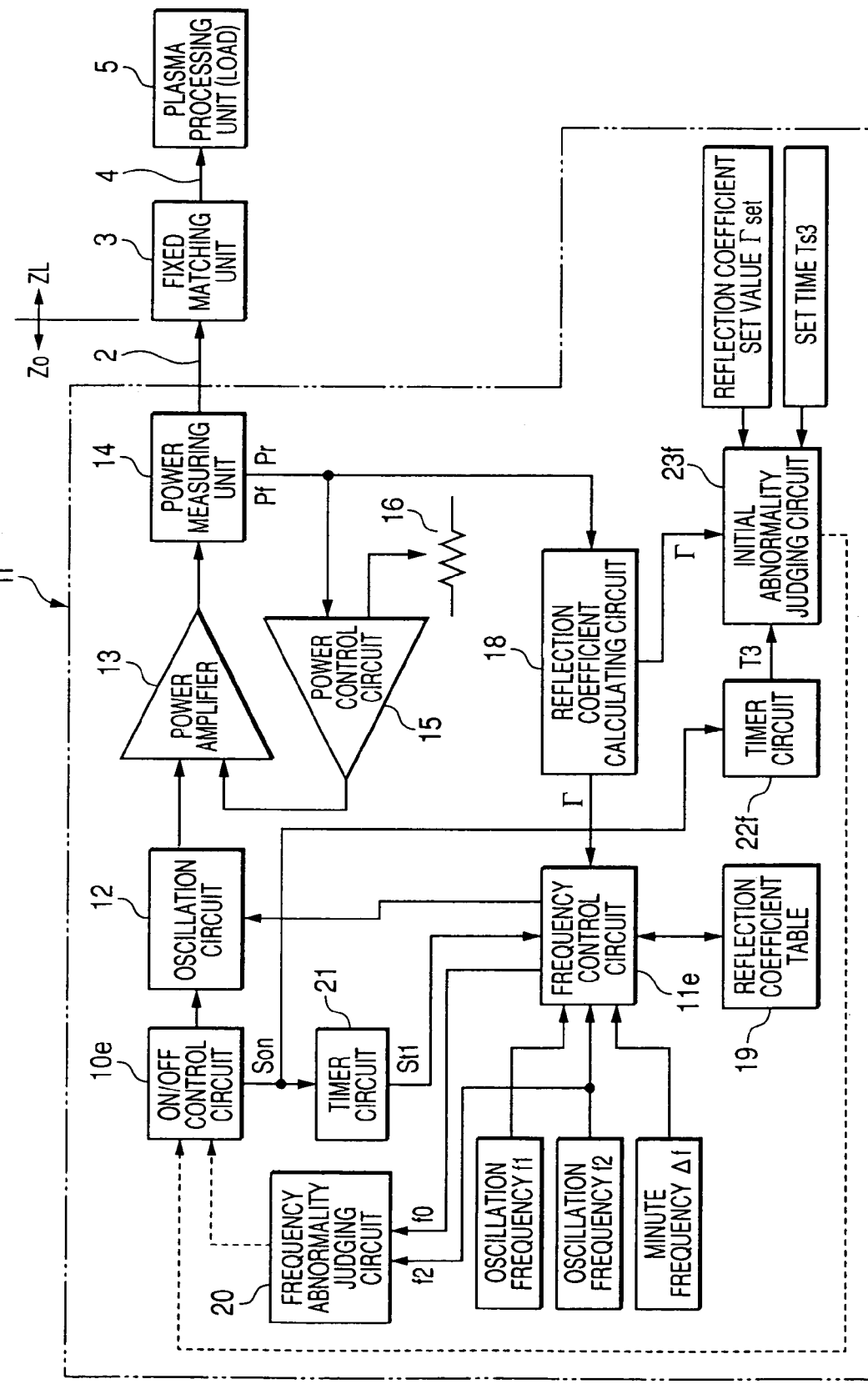
FIG. 16 is a view depicting a configuration of a high-frequency power device 1f according to Embodiment 7 of the invention and a connection between the high-frequency power device 1f, the fixed matching unit 3 and the load 5.

FIG. 16 is a view depicting a configuration of a high-frequency power device 1f according to Embodiment 7 of the invention and a connection between the high-frequency power device 1f, the fixed matching unit 3 and the load 5. The high-frequency power device 1f depicted in FIG. 16 is constructed so that the timer circuit 22 depicted in FIG. 14 is replaced by a timer circuit 22f, the initial abnormality judging circuit 23 is replaced by an initial abnormality judging circuit 23f, and at the same time, a signal Son output from the ON/OFF control circuit 10e is input into the timer circuit 22f. In addition, the set time input into the initial abnormality judging circuit 23f is made into Ts3. Also, since the others depicted in FIG. 16 are identical to those of FIG. 14, a description thereof is omitted.

Differing from FIG. 14, a signal Son output from the ON/OFF control circuit 10e is input into the timer circuit 22f, and the timer circuit 22f is constructed so as to measure the time elapsed after the signal Son is input. That is, a high-frequency signal is output from the oscillation circuit 12, and resultantly, the timer circuit 22f measures the time elapsed after high-frequency power is output from the power amplifier 13 and high-frequency power is supplied to the load, and outputs the measurement time T3.

The initial abnormality judging circuit 23f judges it to be abnormal in a case where the reflection coefficient absolute value Γ does not become the reflection coefficient set value Γ set or less until the measurement time T3 reaches the predetermined set time Ts3. Where it is judged to be abnormal, an abnormality signal is output to a notification device (not illustrated), thereby notifying an abnormality. The set time Ts3 is the time (Ts1+Ts2) in which the discharge estimation time Ts1 described above is added to the set time Ts2. The others are identical to those of the initial abnormality judging circuit 23 of FIG. 14.

Figure 17:
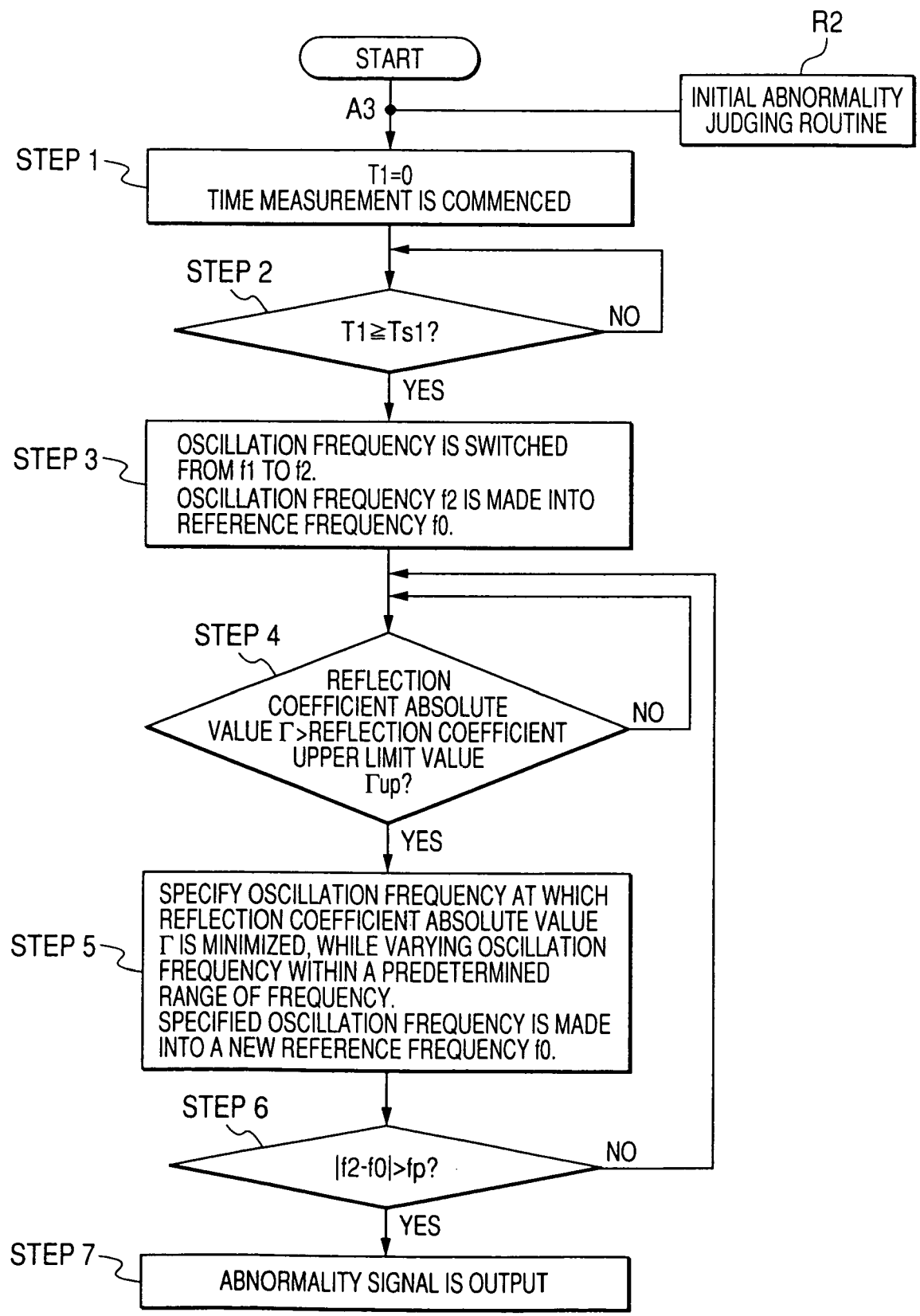
FIG. 17 is a flowchart depicting one example of a control method for matching of impedance during discharge after commencement of the discharge, using the high-frequency power device 1f depicted in FIG. 16.

FIG. 17 is a flowchart depicting one example of a control method for matching of impedance during discharge after commencement of the discharge, using the high-frequency power device 1f depicted in FIG. 16. A description is given of matching of impedance during discharge along the flowchart.

Steps 1 through 7 are identical to those of the flowchart of FIG. 15. A point differing from FIG. 15 is that, in the flowchart of FIG. 17, the initial abnormality judging routine R1 is not provided, a branch point A3 is provided before Step 1 instead, and the initial abnormality judging routine R2 is connected to the branch point A3.

Figure 18:
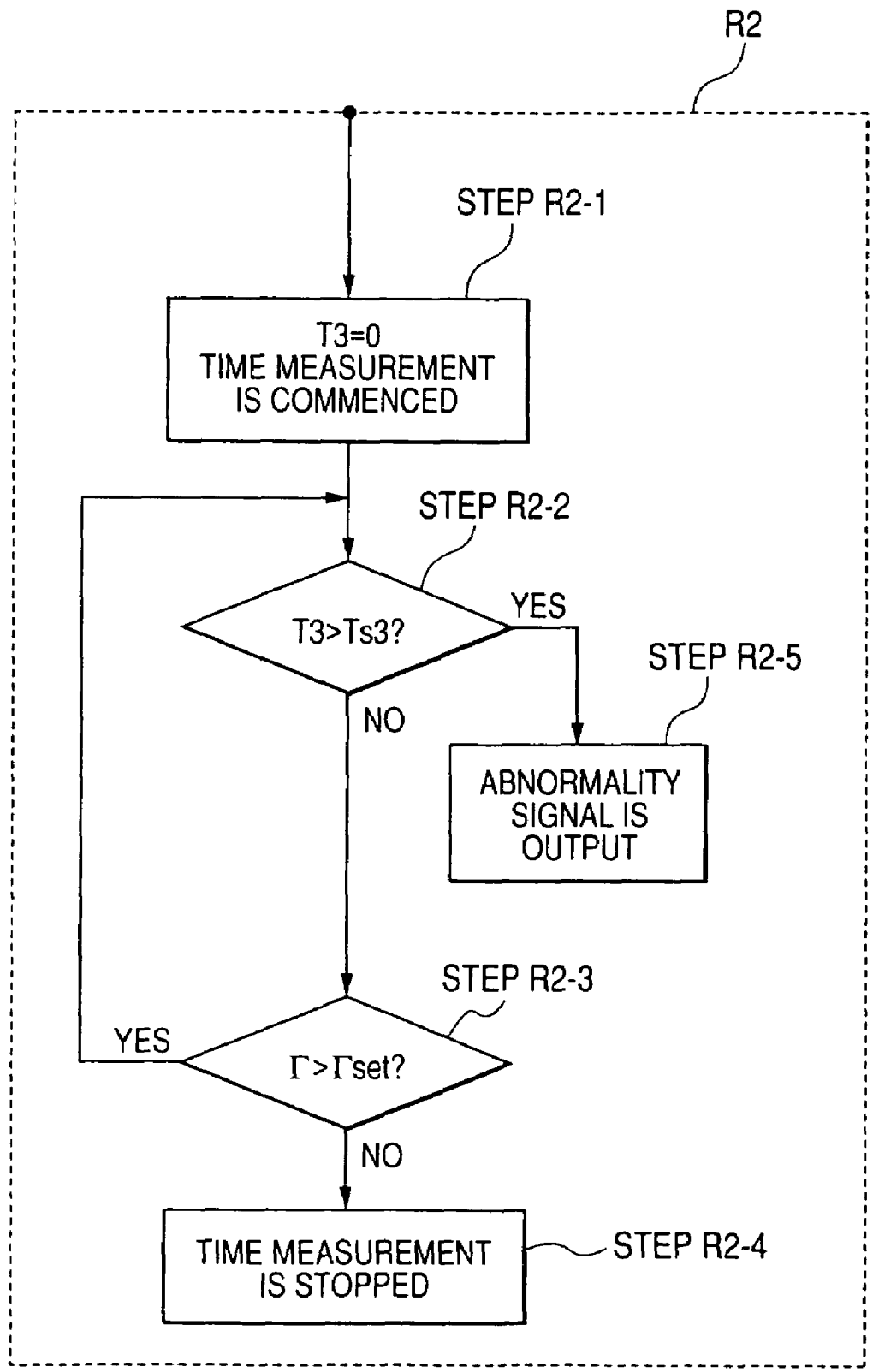
FIG. 18 is a flowchart of the initial abnormality judging routine R2.
Figure 19:
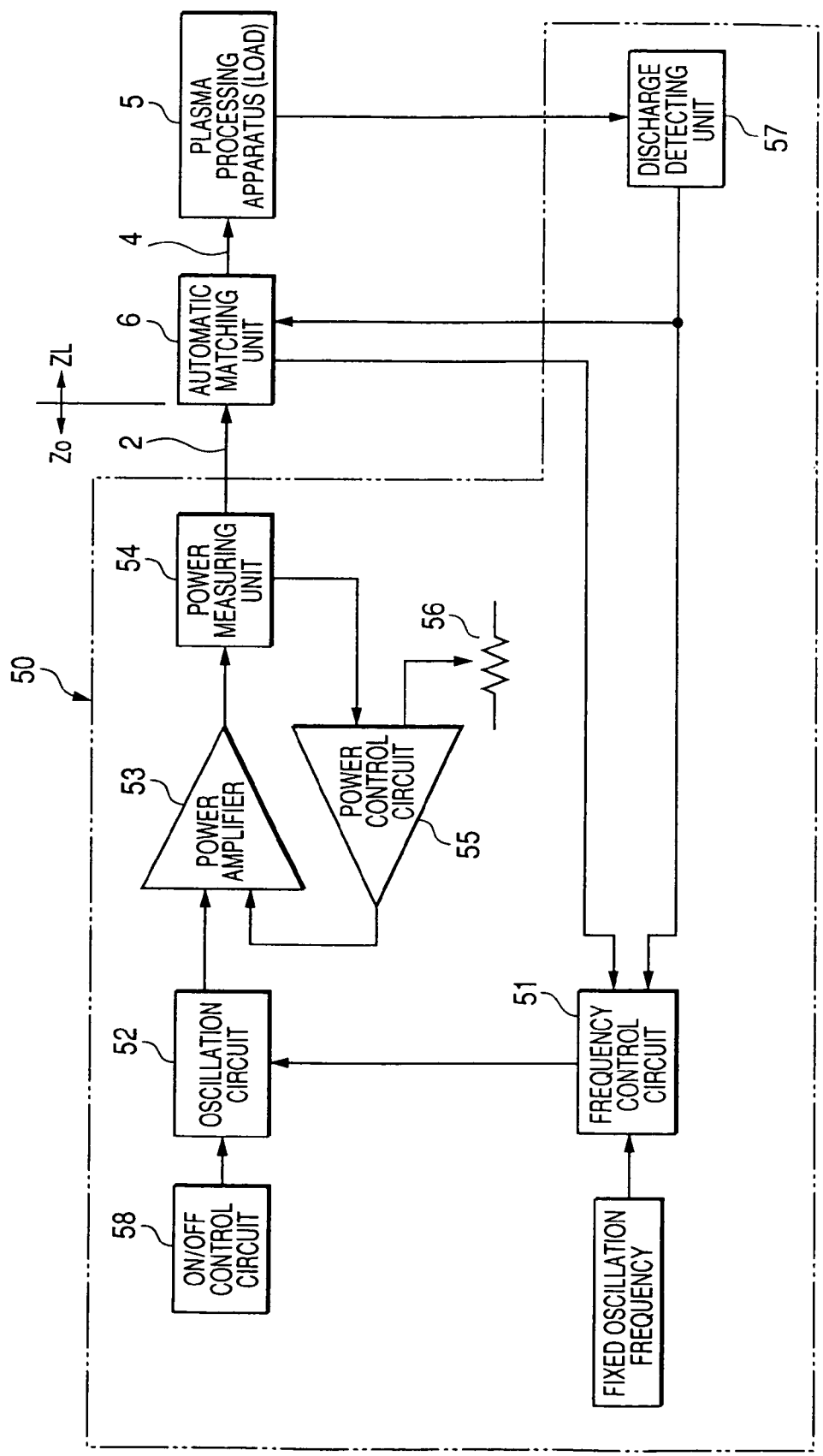
FIG. 19 is a view depicting a configuration of a conventional high-frequency power device 50 and a connection between the high-frequency power device 50, the automatic matching unit 6 and the load 5.

FIG. 18 is a flowchart of the initial abnormality judging routine R2. The initial abnormality judging routine R2 is such that, in the initial abnormality judging routine R1 described above, the measurement time T2 is changed to the measurement time T3, and the set time Ts2 is changed to Ts3.

By thus controlling, it becomes possible to detect an abnormality at the beginning of the process as in the high-frequency power device according to Embodiment 6.

Embodiments 1 through 7 are described above. However, the invention is not limited to these embodiments, but may be subjected to other modifications. For example, such a modification in which the initial abnormality judging routine R2 is connected to the flowcharts described in FIG. 3 and FIG. 7 is available.

What is claimed is:

1. A high-frequency power device comprising:
   an oscillator, adapted to output an oscillation signal and vary an oscillation frequency of the oscillation signal in accordance with an instruction;
   a high-frequency power supplier, adapted to amplify the oscillation signal to supply high-frequency power to a load capable of discharging;
   a reflection coefficient calculator, adapted to calculate an absolute value of a reflection coefficient based on information of high-frequency oriented from the high-frequency power supplier toward a side of the load and high-frequency oriented from the side toward the high-frequency power supplier and output the calculated absolute value to a frequency controller;
   a discharge signal output unit, adapted to output a discharge signal to the frequency controller to change the oscillation frequency before and after the load discharges; and
   the frequency controller, adapted to give the instruction to the oscillator based on the absolute value and the discharge signal, wherein
   the frequency controller:
      instructs the oscillator to oscillate the oscillation signal at a first oscillation frequency for the period of time while the discharge signal is not in a state showing that the discharge has been commenced or in a state where the discharge is regarded as having been commenced, then instructs the oscillator to change the first oscillation frequency to a second oscillation frequency immediately after the discharge signal changes into the states, and then controls the oscillation frequency so that the absolute value is made small.

2. The high-frequency power device according to claim 1, wherein the frequency controller controls the oscillation frequency in such a manner that the frequency controller:

regards the second oscillation frequency as a reference frequency;

determines an upper limit value corresponding to the absolute value of the reflection coefficient at the reference frequency;

instructs, in a case where the absolute value at the reference frequency is the determined upper limit value or less, the oscillator to oscillate the oscillation signal at the reference frequency;

specifies, in a case where the absolute value at the reference frequency exceeds the determined upper limit value, a third oscillation frequency at which the absolute value is minimized while the oscillation frequency is varied in a range of predetermined frequencies including the reference frequency;

stops varying the oscillation frequency at the third oscillation frequency; and regards the third oscillation frequency as the reference frequency.

3. The high-frequency power device according to claim 2, further comprising: a memory adapted to store a relationship between the absolute value and the upper limit value at the reference frequency, wherein the frequency controller determines the upper limit value based on the relationship stored in the memory.

4. The high-frequency power device according to claim 2, wherein the frequency controller determines the upper limit value based on a function by which a relationship between the absolute value and the upper limit value at the reference frequency is set.

5. The high-frequency power device according to claim 2, further comprising a frequency abnormality judging unit, into which the second oscillation frequency and the third oscillation frequency are input and which calculates a deviation between the second oscillation frequency and the third oscillation frequency, and judges an abnormality when the deviation exceeds a predetermined permissible frequency.

6. The high-frequency power device according to claim 1, further comprising:

a first timer, adapted to measure the time elapsed after the oscillator is instructed so as to oscillate the oscillation signal at the first oscillation frequency or the time elapsed after the instruction is changed to cause the oscillator to oscillate the oscillation signal from the first oscillation frequency to the second oscillation frequency; and an initial abnormality judging unit, adapted to judge an abnormality in a case where the absolute value does not become a predetermined value or less until the time measured by the first timer reaches a predetermined time.

7. The high-frequency power device according to claim 1, wherein the discharge signal output unit is a discharge detecting unit adapted to detect existence of discharge in the load, a detection signal output from the discharge detecting unit for showing existence of discharge in the load and the absolute value output from the reflection coefficient calculator are input into the frequency controller when high-frequency power is supplied from the high-frequency power supplier to the load, and the frequency controller judges based on the detection signal whether or not discharge is commenced.

8. The high-frequency power device according to claim 1, wherein the discharge signal output unit is a timer, adapted to measure the time elapsed from commencement of supply of high-frequency power from the high-frequency power supplier to the load, and the measurement time output from the timer and the absolute value output from the reflection coefficient calculator are input into the frequency controller, and the frequency controller:

instructs the oscillator to oscillate at the first oscillation frequency when the measurement time measured by the timer does not reach the predetermined discharge estimation time in a state where high-frequency power is supplied from the high-frequency power supplier to the load; then changes the instruction, so that the oscillator is caused to oscillate at the second predetermined oscillation frequency, immediately after the measurement time measured by the timer reaches the predetermined discharge estimation time, and then controls the oscillation frequency of the oscillator so that the absolute value is made small.

9. A method for controlling high-frequency power device, which supplies high-frequency power to a load capable of discharging and varies an oscillation frequency to determine a frequency of high-frequency power device before and after the load discharges, comprising the steps of:

outputting the high-frequency power with the oscillation frequency being a first oscillation frequency until discharge is commenced in the load or until the time measured from the time at which the high-frequency power device commences supplying high-frequency power to the load reaches a predetermined discharge estimation time, then changing the first oscillation frequency to a second oscillation frequency immediately after discharge is commenced in the load or immediately after the time measured from the time at which the high-frequency power device commences supplying high-frequency power to the load reaches the predetermined discharge estimation time, and outputting the high-frequency power with the oscillation frequency being the second oscillation frequency; and then controlling the oscillation frequency so that an absolute value of a reflection coefficient is made small.

10. The method according to claim 9, wherein the controlling the oscillation frequency comprising:

regarding the second oscillation frequency as a reference frequency;

determining an upper limit value corresponding to the absolute value of the reflection coefficient at the reference frequency;

instructing, in a case where the absolute value at the reference frequency is the determined upper limit value or less, the oscillator to oscillate the oscillation signal at the reference frequency;

specifying, in a case where the absolute value at the reference frequency exceeds the determined upper limit value, a third oscillation frequency at which the absolute value is minimized while the oscillation frequency is varied in a range of predetermined frequencies including the reference frequency;

stopping varying the oscillation frequency at the third oscillation frequency; and regarding the third oscillation frequency as the reference frequency.

11. The method according to claim 10, wherein the determining the upper limit value is executed in such a manner that a relationship between the absolute value and the upper limit value at the reference frequency is stored in advance, and the upper limit value is determined based on the stored relationship.

12. The method according to claim 10, wherein the determining the upper limit value is executed in such a manner that a relationship between the absolute value and the upper limit value at the reference frequency is determined in advance by a function, and the upper limit value is determined based on the function.

13. The method according to claim 10, wherein a deviation between the second oscillation frequency and the third oscillation frequency is calculated by inputting the second oscillation frequency and the third oscillation frequency, and it is judged to be abnormal when the deviation exceeds a predetermined permissible frequency.

14. The method according to claim 9, wherein it is judged to be abnormal when the absolute value does not become a predetermined value or less until the time elapsed after an instruction of oscillating at the first oscillation frequency is issued or the time elapsed after an instruction of varying the oscillation frequency from the first oscillation frequency to the second predetermined oscillation frequency is issued reaches a predetermined period of time.

* * * * *